United States Patent
Ledenev et al.

(10) Patent No.: US 10,714,637 B2
(45) Date of Patent: Jul. 14, 2020

(54) DC POWER CONVERSION CIRCUIT

(71) Applicant: AMPT, LLC, Fort Collins, CO (US)

(72) Inventors: Anatoli Ledenev, Fort Collins, CO (US); Robert M. Porter, Wellington, CO (US)

(73) Assignee: AMPT, LLC, Fort Collins, CO (US)

( * ) Notice: Subject to any disclaimer, the term of this patent is extended or adjusted under 35 U.S.C. 154(b) by 163 days.

(21) Appl. No.: 16/028,188

(22) Filed: Jul. 5, 2018

(65) Prior Publication Data

US 2018/0374965 A1    Dec. 27, 2018

Related U.S. Application Data

(63) Continuation of application No. 15/164,806, filed on May 25, 2016, now Pat. No. 10,032,939, which is a
(Continued)

(51) Int. Cl.
*H01L 31/02* (2006.01)
*H02J 3/38* (2006.01)
(Continued)

(52) U.S. Cl.
CPC ........ *H01L 31/02021* (2013.01); *H02J 3/383* (2013.01); *H02J 3/385* (2013.01);
(Continued)

(58) Field of Classification Search
CPC ..... H01L 31/02021; H02J 3/383; H02J 3/385; H02M 3/08; H02M 3/155; H02M 7/44;
(Continued)

(56) References Cited

U.S. PATENT DOCUMENTS

| | | |
|---|---|---|
| 3,900,946 A | 8/1975 | Sirtl et al. |
| 4,127,797 A | 11/1978 | Perper |
| | (Continued) | |

FOREIGN PATENT DOCUMENTS

| | | |
|---|---|---|
| CA | 2702392 | 9/2015 |
| CA | 2737134 | 10/2017 |
| | (Continued) | |

OTHER PUBLICATIONS

International Application Publication No. 2008/125915A3, published Oct. 23, 2008. Applicant: SolarEdge Technologies. Abstract and Search Report. 4 pages.
(Continued)

*Primary Examiner* — Hal Kaplan
(74) *Attorney, Agent, or Firm* — Santangelo Law Offices, P.C.

(57) ABSTRACT

The inventive technology, in certain embodiments, may be generally described as a solar power generation system with a converter, which may potentially include two or more sub-converters, established intermediately of one or more strings of solar panels. Particular embodiments may involve sweet spot operation in order to achieve improvements in efficiency, and bucking of open circuit voltages by the converter in order that more panels may be placed on an individual string or substring, reducing the number of strings required for a given design, and achieving overall system and array manufacture savings.

17 Claims, 10 Drawing Sheets

Related U.S. Application Data continuation of application No. 13/503,011, filed as application No. PCT/US2010/053253 on Oct. 19, 2010, now Pat. No. 9,466,737.

(60) Provisional application No. 61/253,025, filed on Oct. 19, 2009.

(51) Int. Cl.
| | |
|---|---|
| H02M 3/155 | (2006.01) |
| H02M 3/08 | (2006.01) |
| H02M 7/44 | (2006.01) |
| H02S 40/32 | (2014.01) |
| H02S 40/36 | (2014.01) |
| G05F 1/67 | (2006.01) |

(52) U.S. Cl.
CPC ............ *H02M 3/08* (2013.01); *H02M 3/155* (2013.01); *H02M 7/44* (2013.01); *G05F 1/67* (2013.01); *H02S 40/32* (2014.12); *H02S 40/36* (2014.12); *Y02E 10/563* (2013.01); *Y02E 10/58* (2013.01); *Y10T 307/50* (2015.04); *Y10T 307/707* (2015.04)

(58) Field of Classification Search
CPC ........ H02S 40/32; H02S 40/36; Y10T 307/50; Y10T 307/707; G05F 1/67; Y02E 10/563; Y02E 10/58
USPC ..................................... 307/43, 82
See application file for complete search history.

(56) References Cited

U.S. PATENT DOCUMENTS

| | | |
|---|---|---|
| 4,168,124 A | 9/1979 | Pizzi |
| 4,218,139 A | 8/1980 | Sheffield |
| 4,222,665 A | 9/1980 | Tachizawa |
| 4,249,958 A | 2/1981 | Baudin |
| 4,274,044 A | 6/1981 | Barre |
| 4,341,607 A | 7/1982 | Tison |
| 4,375,662 A | 3/1983 | Baker |
| 4,390,940 A | 6/1983 | Corbefin et al. |
| 4,395,675 A | 7/1983 | Toumani |
| 4,404,472 A | 9/1983 | Steigerwald |
| 4,409,537 A | 10/1983 | Harris |
| 4,445,030 A | 4/1984 | Carlson |
| 4,445,049 A | 4/1984 | Steigerwald |
| 4,513,167 A | 4/1985 | Brandstetter |
| 4,528,503 A | 7/1985 | Cole |
| 4,580,090 A | 4/1986 | Bailey et al. |
| 4,581,716 A | 4/1986 | Kamiya |
| 4,619,863 A | 10/1986 | Taylor |
| 4,626,983 A | 12/1986 | Harada et al. |
| 4,634,943 A | 1/1987 | Reick |
| 4,649,334 A | 3/1987 | Nakajima |
| 4,652,770 A | 3/1987 | Kumano |
| 4,725,740 A | 2/1988 | Nakata |
| 4,749,982 A | 6/1988 | Rikuna et al. |
| 4,794,909 A | 1/1989 | Elden |
| 4,873,480 A | 10/1989 | Lafferty |
| 4,896,034 A | 1/1990 | Kiriseko |
| 4,899,269 A | 2/1990 | Rouzies |
| 4,922,396 A | 5/1990 | Niggemeyer |
| 5,027,051 A | 6/1991 | Lafferty |
| 5,028,861 A | 7/1991 | Pace et al. |
| 5,144,222 A | 9/1992 | Herbert |
| 5,179,508 A | 1/1993 | Lange et al. |
| 5,270,636 A | 12/1993 | Lafferty |
| 5,401,561 A | 3/1995 | Fisun et al. |
| 5,402,060 A | 3/1995 | Erisman |
| 5,493,155 A | 2/1996 | Okamoto et al. |
| 5,493,204 A | 2/1996 | Caldwell |
| 5,503,260 A | 4/1996 | Riley |
| 5,646,502 A | 7/1997 | Johnson |
| 5,648,731 A | 7/1997 | Decker et al. |
| 5,659,465 A | 8/1997 | Flack et al. |
| 5,669,987 A | 9/1997 | Takehara et al. |
| 5,689,242 A | 11/1997 | Sims et al. |
| 5,741,370 A | 4/1998 | Hanoka |
| 5,747,967 A | 5/1998 | Muljadi et al. |
| 5,782,994 A | 7/1998 | Mori et al. |
| 5,801,519 A | 9/1998 | Midya et al. |
| 5,896,281 A | 4/1999 | Bingley |
| 5,898,585 A | 4/1999 | Sirichote et al. |
| 5,923,100 A | 7/1999 | Lukens et al. |
| 5,932,994 A | 8/1999 | Jo et al. |
| 6,046,401 A | 4/2000 | McCabe |
| 6,081,104 A | 6/2000 | Kern |
| 6,124,769 A | 9/2000 | Igarashi et al. |
| 6,162,986 A | 12/2000 | Shiotsuka |
| 6,180,868 B1 | 1/2001 | Yoshino et al. |
| 6,181,590 B1 | 1/2001 | Yamane et al. |
| 6,191,501 B1 | 2/2001 | Bos |
| 6,218,605 B1 | 4/2001 | Daily et al. |
| 6,218,820 B1 | 4/2001 | D'Arrigo et al. |
| 6,219,623 B1 | 4/2001 | Wills |
| 6,262,558 B1 | 7/2001 | Weinberg |
| 6,278,052 B1 | 8/2001 | Takehara et al. |
| 6,281,485 B1 | 8/2001 | Siri |
| 6,282,104 B1 | 8/2001 | Kern |
| 6,314,007 B2 | 11/2001 | Johnson, Jr. et al. |
| 6,331,670 B2 | 12/2001 | Takehara et al. |
| 6,351,400 B1 | 2/2002 | Lumsden |
| 6,369,462 B1 | 4/2002 | Siri |
| 6,433,522 B1 | 8/2002 | Siri |
| 6,433,992 B2 | 8/2002 | Nakagawa et al. |
| 6,441,896 B1 | 8/2002 | Field |
| 6,448,489 B2 | 9/2002 | Kimura et al. |
| 6,493,246 B2 | 12/2002 | Suzui et al. |
| 6,515,215 B1 | 2/2003 | Mimura |
| 6,545,211 B1 | 4/2003 | Mimura |
| 6,545,868 B1 | 4/2003 | Kledzik et al. |
| 6,593,521 B2 | 7/2003 | Kobayashi |
| 6,600,668 B1 | 7/2003 | Patel |
| 6,624,350 B2 | 9/2003 | Nixon et al. |
| 6,670,721 B2 | 12/2003 | Lof et al. |
| 6,686,533 B2 | 2/2004 | Raum et al. |
| 6,686,727 B2 | 2/2004 | Ledenev et al. |
| 6,696,823 B2 | 2/2004 | Ledenev et al. |
| 6,703,555 B2 | 3/2004 | Takabayashi et al. |
| 6,750,391 B2 | 6/2004 | Bower et al. |
| 6,791,024 B2 | 9/2004 | Toyomura |
| 6,798,177 B1 | 9/2004 | Liu et al. |
| 6,804,127 B2 | 10/2004 | Zhou |
| 6,889,122 B2 | 5/2005 | Perez |
| 6,914,418 B2 | 7/2005 | Sung |
| 6,914,420 B2 | 7/2005 | Crocker |
| 6,920,055 B1 | 7/2005 | Zeng et al. |
| 6,952,355 B2 | 10/2005 | Rissio et al. |
| 6,958,922 B2 | 10/2005 | Kazem |
| 6,984,965 B2 | 1/2006 | Vinciarelli |
| 6,984,970 B2 | 1/2006 | Capel |
| 7,019,988 B2 | 3/2006 | Fung et al. |
| 7,046,531 B2 | 5/2006 | Zocchi et al. |
| 7,068,017 B2 | 6/2006 | Willner et al. |
| 7,072,194 B2 | 7/2006 | Nayar et al. |
| 7,091,707 B2 | 8/2006 | Cutler |
| 7,092,265 B2 | 8/2006 | Kernahan |
| 7,158,395 B2 | 1/2007 | Deng et al. |
| 7,193,872 B2 | 3/2007 | Siri |
| 7,227,278 B2 | 6/2007 | Realmuto et al. |
| 7,248,946 B2 | 7/2007 | Bashaw et al. |
| 7,274,975 B2 | 9/2007 | Miller |
| 7,333,916 B2 | 2/2008 | Warfield et al. |
| 7,339,287 B2 | 3/2008 | Jepsen et al. |
| 7,365,661 B2 | 4/2008 | Thomas |
| 7,471,073 B2 | 12/2008 | Rettenwort et al. |
| 7,479,774 B2 | 1/2009 | Wai |
| 7,514,900 B2 | 4/2009 | Sander et al. |
| 7,596,008 B2 | 9/2009 | Iwata et al. |
| D602,432 S | 10/2009 | Moussa |
| 7,602,080 B1 | 10/2009 | Hadar et al. |
| 7,605,498 B2 | 10/2009 | Ledenev et al. |

(56) References Cited

U.S. PATENT DOCUMENTS

| | | |
|---|---|---|
| 7,619,200 B1 | 11/2009 | Seymour et al. |
| 7,619,323 B2 | 11/2009 | Tan et al. |
| 7,663,342 B2 | 2/2010 | Kimball et al. |
| 7,719,140 B2 | 5/2010 | Ledenev et al. |
| 7,768,155 B2 | 8/2010 | Fornage |
| 7,786,716 B2 | 8/2010 | Simburger et al. |
| 7,807,919 B2 | 10/2010 | Powell |
| 7,834,580 B2 | 11/2010 | Haines |
| 7,843,085 B2 | 11/2010 | Ledenev et al. |
| 7,919,953 B2 | 4/2011 | Porter et al. |
| 7,948,221 B2 | 5/2011 | Watanabe et al. |
| 7,962,249 B1 | 6/2011 | Zhang et al. |
| 8,004,116 B2 | 8/2011 | Ledenev et al. |
| 8,013,472 B2 | 9/2011 | Adest et al. |
| 8,018,748 B2 | 9/2011 | Leonard |
| 8,058,747 B2 | 11/2011 | Avrutsky et al. |
| 8,093,756 B2 | 1/2012 | Porter et al. |
| 8,106,765 B1 | 1/2012 | Ackerson et al. |
| 8,242,634 B2 | 8/2012 | Schatz et al. |
| 8,264,195 B2 | 9/2012 | Takehara et al. |
| 8,273,979 B2 | 9/2012 | Weir |
| 8,304,932 B2 | 11/2012 | Ledenev et al. |
| 8,314,375 B2 | 11/2012 | Arditi et al. |
| 8,461,811 B2 | 6/2013 | Porter et al. |
| 8,473,250 B2 | 6/2013 | Adest |
| 8,482,153 B2 | 7/2013 | Ledenev et al. |
| 8,531,055 B2 | 9/2013 | Adest et al. |
| 8,593,103 B2 | 11/2013 | Takehara et al. |
| 8,816,535 B2 | 8/2014 | Adest et al. |
| 8,854,193 B2 | 10/2014 | Makhota et al. |
| 8,860,241 B2 | 10/2014 | Hadar et al. |
| 9,042,145 B2 | 5/2015 | Schill |
| 9,112,379 B2 | 8/2015 | Sella et al. |
| 9,366,714 B2 | 6/2016 | Ledenev et al. |
| 9,368,964 B2 | 6/2016 | Adest et al. |
| 9,397,497 B2 | 7/2016 | Ledenev |
| 9,438,037 B2 | 9/2016 | Ledenev et al. |
| 9,442,504 B2 | 9/2016 | Porter et al. |
| 9,466,737 B2 | 10/2016 | Ledenev |
| 9,673,630 B2 | 6/2017 | Ledenev et al. |
| 10,032,939 B2 | 7/2018 | Ledenev et al. |
| 10,116,140 B2 | 10/2018 | Ledenev et al. |
| 10,326,282 B2 | 6/2019 | Porter et al. |
| 10,326,283 B2 | 6/2019 | Porter et al. |
| 10,608,437 B2 | 3/2020 | Ledenev et al. |
| 2001/0007522 A1 | 7/2001 | Nakagawa et al. |
| 2001/0032664 A1 | 10/2001 | Takehara et al. |
| 2002/0038200 A1 | 3/2002 | Shimizu et al. |
| 2002/0195136 A1 | 12/2002 | Takabayashi et al. |
| 2003/0062078 A1 | 4/2003 | Mimura |
| 2003/0075211 A1 | 4/2003 | Makita et al. |
| 2003/0117822 A1 | 6/2003 | Stamenic et al. |
| 2003/0218449 A1 | 11/2003 | Ledenev et al. |
| 2004/0027112 A1 | 2/2004 | Kondo et al. |
| 2004/0085048 A1 | 5/2004 | Tateishi |
| 2004/0095020 A1 | 5/2004 | Kernahan et al. |
| 2004/0100149 A1 | 5/2004 | Lai |
| 2004/0135560 A1 | 7/2004 | Kernahan |
| 2004/0159102 A1 | 8/2004 | Toyomura et al. |
| 2004/0164557 A1 | 8/2004 | West |
| 2004/0207366 A1 | 10/2004 | Sung |
| 2004/0211456 A1 | 10/2004 | Brown |
| 2005/0002214 A1 | 1/2005 | Deng et al. |
| 2005/0068012 A1 | 3/2005 | Cutler |
| 2005/0093526 A1 | 5/2005 | Notman |
| 2005/0105224 A1 | 5/2005 | Nishi |
| 2005/0109386 A1 | 5/2005 | Marshall |
| 2005/0116475 A1 | 6/2005 | Hibi et al. |
| 2005/0121067 A1 | 6/2005 | Toyomura |
| 2005/0162018 A1 | 7/2005 | Realmuto et al. |
| 2005/0169018 A1 | 8/2005 | Hatai et al. |
| 2005/0254191 A1 | 11/2005 | Bashaw et al. |
| 2006/0017327 A1 | 1/2006 | Siri et al. |
| 2006/0103360 A9 | 5/2006 | Cutler |
| 2006/0162772 A1 | 7/2006 | Preser et al. |
| 2006/0171182 A1 | 8/2006 | Siri et al. |
| 2006/0174939 A1 | 8/2006 | Matan |
| 2007/0024257 A1 | 2/2007 | Boldo |
| 2007/0035975 A1 | 2/2007 | Dickerson et al. |
| 2007/0044837 A1 | 3/2007 | Simburger et al. |
| 2007/0069520 A1 | 3/2007 | Schetters |
| 2007/0111103 A1 | 5/2007 | Konishiike et al. |
| 2007/0119718 A1 | 5/2007 | Gibson et al. |
| 2007/0133241 A1 | 6/2007 | Mumtaz et al. |
| 2007/0159866 A1 | 7/2007 | Siri |
| 2007/0165347 A1 | 7/2007 | Wendt et al. |
| 2007/0171680 A1 | 7/2007 | Perreault et al. |
| 2007/0236187 A1 | 10/2007 | Wai et al. |
| 2008/0036440 A1 | 2/2008 | Garmer |
| 2008/0062724 A1 | 3/2008 | Feng et al. |
| 2008/0097655 A1 | 4/2008 | Hadar et al. |
| 2008/0101101 A1 | 5/2008 | Iwata et al. |
| 2008/0111517 A1 | 5/2008 | Pfeifer et al. |
| 2008/0123375 A1 | 5/2008 | Beardsley |
| 2008/0136367 A1 | 6/2008 | Adest et al. |
| 2008/0143188 A1 | 6/2008 | Adest et al. |
| 2008/0144294 A1 | 6/2008 | Adest et al. |
| 2008/0147335 A1 | 6/2008 | Adest et al. |
| 2008/0150366 A1 | 6/2008 | Adest et al. |
| 2008/0164766 A1 | 7/2008 | Adest et al. |
| 2008/0186004 A1 | 8/2008 | Williams |
| 2008/0236648 A1 | 10/2008 | Klein et al. |
| 2008/0238195 A1 | 10/2008 | Shaver |
| 2008/0247201 A1 | 10/2008 | Perol |
| 2008/0257397 A1 | 10/2008 | Glaser et al. |
| 2009/0020151 A1 | 1/2009 | Fornage |
| 2009/0039852 A1 | 2/2009 | Fisehlov et al. |
| 2009/0078300 A1 | 3/2009 | Ang et al. |
| 2009/0114263 A1 | 5/2009 | Powell et al. |
| 2009/0120485 A1 | 5/2009 | Kikinis |
| 2009/0133736 A1 | 5/2009 | Powell et al. |
| 2009/0097655 A1 | 6/2009 | Hadar et al. |
| 2009/0140715 A1 | 6/2009 | Adest et al. |
| 2009/0141522 A1 | 6/2009 | Adest et al. |
| 2009/0145480 A1 | 6/2009 | Adest et al. |
| 2009/0146505 A1 | 6/2009 | Powell et al. |
| 2009/0146667 A1 | 6/2009 | Adest et al. |
| 2009/0146671 A1 | 6/2009 | Gazit |
| 2009/0147554 A1 | 6/2009 | Adest et al. |
| 2009/0150005 A1 | 6/2009 | Hadar et al. |
| 2009/0160258 A1 | 6/2009 | Allen et al. |
| 2009/0206666 A1 | 8/2009 | Sella |
| 2009/0207543 A1 | 8/2009 | Boniface et al. |
| 2009/0218887 A1 | 9/2009 | Ledenev et al. |
| 2009/0234692 A1 | 9/2009 | Powell et al. |
| 2009/0237042 A1 | 9/2009 | Glovinksi |
| 2009/0237043 A1 | 9/2009 | Glovinksi |
| 2009/0273241 A1 | 11/2009 | Gazit et al. |
| 2009/0283128 A1 | 11/2009 | Zhang et al. |
| 2009/0283129 A1 | 11/2009 | Foss |
| 2009/0284078 A1 | 11/2009 | Zhang et al. |
| 2009/0284232 A1 | 11/2009 | Zhang et al. |
| 2009/0284240 A1 | 11/2009 | Zhang et al. |
| 2009/0284998 A1 | 11/2009 | Zhang et al. |
| 2010/0001587 A1 | 1/2010 | Casey et al. |
| 2010/0026097 A1 | 2/2010 | Avrutsky et al. |
| 2010/0027297 A1 | 2/2010 | Avrutsky et al. |
| 2010/0038968 A1 | 2/2010 | Ledenev et al. |
| 2010/0078057 A1 | 4/2010 | Karg et al. |
| 2010/0085670 A1 | 4/2010 | Palaniswami et al. |
| 2010/0089431 A1 | 4/2010 | Weir |
| 2010/0117858 A1 | 5/2010 | Rozenboim |
| 2010/0118985 A1 | 5/2010 | Rozenboim |
| 2010/0127570 A1 | 6/2010 | Hadar et al. |
| 2010/0127571 A1 | 6/2010 | Hadar et al. |
| 2010/0132758 A1 | 6/2010 | Gilmore |
| 2010/0139732 A1 | 6/2010 | Hadar et al. |
| 2010/0139734 A1 | 6/2010 | Hadar et al. |
| 2010/0139743 A1 | 6/2010 | Hadar et al. |
| 2010/0195361 A1 | 8/2010 | Stem |
| 2010/0229915 A1 | 9/2010 | Ledenev et al. |
| 2010/0246230 A1 | 9/2010 | Porter et al. |
| 2010/0253150 A1 | 10/2010 | Porter et al. |
| 2010/0308662 A1 | 12/2010 | Schatz et al. |

(56) References Cited

U.S. PATENT DOCUMENTS

| | | |
|---|---|---|
| 2010/0327659 A1 | 12/2010 | Lisi |
| 2011/0005567 A1 | 1/2011 | Vandersluis et al. |
| 2011/0067745 A1 | 3/2011 | Ledenev et al. |
| 2011/0095613 A1 | 4/2011 | Huang et al. |
| 2011/0115300 A1 | 5/2011 | Chiang et al. |
| 2011/0127841 A1 | 6/2011 | Chiang et al. |
| 2011/0160930 A1 | 6/2011 | Batten et al. |
| 2011/0175454 A1 | 7/2011 | Williams et al. |
| 2011/0181251 A1 | 7/2011 | Porter et al. |
| 2011/0193515 A1 | 8/2011 | Wu et al. |
| 2011/0210611 A1 | 9/2011 | Ledenev et al. |
| 2011/0316346 A1 | 12/2011 | Porter et al. |
| 2012/0003251 A1 | 2/2012 | Ledenev et al. |
| 2012/0043818 A1 | 2/2012 | Stratakos et al. |
| 2012/0104864 A1 | 5/2012 | Porter et al. |
| 2012/0175963 A1 | 7/2012 | Adest et al. |
| 2012/0223584 A1 | 9/2012 | Ledenev et al. |
| 2013/0271096 A1 | 10/2013 | Inagaki |
| 2014/0045325 A1 | 1/2014 | Ledenev et al. |
| 2015/0100257 A1 | 4/2015 | Adest et al. |
| 2015/0130284 A1 | 5/2015 | Ledenev et al. |
| 2016/0156384 A1 | 6/2016 | Fabre et al. |
| 2016/0226257 A1 | 8/2016 | Porter et al. |
| 2016/0268809 A1 | 9/2016 | Ledenev et al. |
| 2016/0329720 A1 | 11/2016 | Ledenev et al. |
| 2016/0336899 A1 | 11/2016 | Ledenev et al. |
| 2016/0365734 A1 | 12/2016 | Ledenev |
| 2016/0380436 A1 | 12/2016 | Porter et al. |
| 2017/0271879 A1 | 9/2017 | Ledenev et al. |
| 2017/0373503 A1 | 12/2017 | Ledenev |
| 2018/0048161 A1 | 2/2018 | Porter et al. |
| 2019/0131794 A1 | 5/2019 | Ledenev |
| 2019/0296555 A1 | 9/2019 | Porter et al. |
| 2019/0296556 A1 | 9/2019 | Porter et al. |

FOREIGN PATENT DOCUMENTS

| | | |
|---|---|---|
| CA | 2942616 A1 | 11/2019 |
| CN | 1470098 A | 1/2004 |
| CN | 101257221 A | 8/2008 |
| CN | 101904015 A | 12/2010 |
| CN | 102013853 A | 4/2011 |
| EP | 0178446 B1 | 1/1989 |
| EP | 0383971 A1 | 8/1990 |
| EP | 677749 A2 | 10/1995 |
| EP | 824273 A2 | 2/1998 |
| EP | 964415 A1 | 12/1999 |
| EP | 964457 A2 | 12/1999 |
| EP | 780750 B1 | 3/2002 |
| EP | 1291997 A2 | 3/2003 |
| EP | 1388927 A2 | 2/2004 |
| EP | 2017948 A2 | 1/2009 |
| EP | 2515424 A2 | 10/2012 |
| EP | 3176933 A1 | 6/2017 |
| EP | 324505 A1 | 5/2018 |
| EP | 3324505 A1 | 5/2018 |
| GB | 310362 | 9/1929 |
| GB | 612859 | 11/1948 |
| GB | 1231961 | 5/1971 |
| GB | 424556.9 | 11/2005 |
| GB | 2415841 A | 1/2006 |
| GB | 2419968 A | 5/2006 |
| GB | 2421847 A | 7/2006 |
| GB | 2434490 A | 7/2007 |
| IN | 280874 | 2/2017 |
| JP | 62-256156 | 7/1987 |
| JP | 07-302130 | 11/1995 |
| JP | 8046231 A | 2/1996 |
| JP | 2000-174307 | 6/2000 |
| JP | 2006020390 A | 6/2004 |
| JP | 2007058845 A | 8/2007 |
| JP | 2007-325371 A | 12/2007 |
| JP | 2011-193548 A | 9/2011 |
| JP | 2012-60714 A | 3/2012 |
| KR | 1020070036528 A | 3/2007 |
| TW | 201037958 A | 10/2010 |
| WO | 90/03680 | 4/1990 |
| WO | 9003680 A1 | 4/1990 |
| WO | 02/17469 A1 | 2/2002 |
| WO | 02/073785 A1 | 9/2002 |
| WO | 03/036688 A2 | 5/2003 |
| WO | 2004100344 A2 | 11/2004 |
| WO | 2004100348 A1 | 11/2004 |
| WO | 2004107543 A2 | 12/2004 |
| WO | 2005027300 A1 | 3/2005 |
| WO | 2005036725 A1 | 4/2005 |
| WO | 2005076445 A1 | 8/2005 |
| WO | 2006005125 A1 | 1/2006 |
| WO | 2006013600 A2 | 2/2006 |
| WO | 2006048688 A1 | 5/2006 |
| WO | 2006048689 A2 | 5/2006 |
| WO | 2006071436 A2 | 7/2006 |
| WO | 2006078685 A2 | 7/2006 |
| WO | 2006117551 A2 | 11/2006 |
| WO | 2006137948 A2 | 12/2006 |
| WO | 2007007360 A2 | 1/2007 |
| WO | 2007080429 A2 | 7/2007 |
| WO | 2007142693 A2 | 12/2007 |
| WO | 2008069926 A3 | 6/2008 |
| WO | 2008125915 A2 | 10/2008 |
| WO | 2008132553 A2 | 11/2008 |
| WO | 2008142480 A2 | 11/2008 |
| WO | 2008142480 A4 | 11/2008 |
| WO | 2009003680 A1 | 1/2009 |
| WO | 2009007782 A2 | 1/2009 |
| WO | 2009007782 A3 | 1/2009 |
| WO | 2009051853 A1 | 4/2009 |
| WO | 2009051854 A1 | 4/2009 |
| WO | 2009051870 A1 | 4/2009 |
| WO | 2009055474 A1 | 4/2009 |
| WO | 2009059028 A2 | 5/2009 |
| WO | 2009064683 A2 | 5/2009 |
| WO | 2009072075 A2 | 6/2009 |
| WO | 2009072075 A9 | 6/2009 |
| WO | 2009072076 A2 | 6/2009 |
| WO | 2009072076 A3 | 6/2009 |
| WO | 2009072077 A1 | 6/2009 |
| WO | 2009073867 A1 | 6/2009 |
| WO | 2009073868 A1 | 6/2009 |
| WO | 2009075985 A2 | 6/2009 |
| WO | 2009114341 A2 | 9/2009 |
| WO | 2009118682 A2 | 10/2009 |
| WO | 2009118682 A3 | 10/2009 |
| WO | 2009118682 A4 | 10/2009 |
| WO | 2009118683 A2 | 10/2009 |
| WO | 2009118683 A3 | 10/2009 |
| WO | 2009118683 A4 | 10/2009 |
| WO | 2009136358 A1 | 11/2009 |
| WO | 2009136358 A4 | 11/2009 |
| WO | 2009140536 A2 | 11/2009 |
| WO | 2009140539 A2 | 11/2009 |
| WO | 2009140539 A3 | 11/2009 |
| WO | 2009140543 A2 | 11/2009 |
| WO | 2009140551 A2 | 11/2009 |
| WO | 2010014116 A1 | 2/2010 |
| WO | 2010062662 A2 | 6/2010 |
| WO | 2010065043 A1 | 6/2010 |
| WO | 2010262410 A1 | 6/2010 |
| WO | 2010002960 A1 | 7/2010 |
| WO | 2010120315 A1 | 10/2010 |
| WO | 2011049985 A1 | 4/2011 |
| WO | 2011110933 A8 | 9/2011 |
| WO | 2012/024538 A3 | 2/2012 |
| WO | 2012024540 A3 | 2/2012 |
| WO | 2012100263 A2 | 7/2012 |
| WO | 2014143021 A1 | 9/2014 |

OTHER PUBLICATIONS

International Application Publication No. 2008/132551A3, published Nov. 6, 2008. Applicant: SolarEdge Technologies. Abstract and Search Report. 7 pages.

(56) References Cited

OTHER PUBLICATIONS

International Application Publication No. 2008/142480A3, published Nov. 27, 2008. Applicant: SolarEdge Technologies. Abstract and Search Report. 5 pages.
U.S. Appl. No. 62/385,032, filed Sep. 8, 2016. First Named Inventor: Anatoli Ledenev.
U.S. Appl. No. 15/262,916, filed Sep. 12, 2016. First Named Inventor: Robert M. Porter.
U.S. Appl. No. 14/550,574, filed Nov. 21, 2014. First Named Inventor: Anatoli Ledenev.
International Application No. PCT/US13/032410, filed Mar. 15, 2013. First Named Inventor: Anatoli Ledenev.
U.S. Appl. No. 15/213,193, filed Jul. 18, 2016. First Named Inventor: Anatoli Ledenev.
Japanese Patent Application No. 2016-500068, international filing date: Mar. 15, 2013, Office Action dated Sep. 30, 2016, dated Oct. 4, 2016. 8 pages.
U.S. Appl. No. 15/219,149, filed Jul. 25, 2016. First named Inventor: Anatoli Ledenev.
U.S. Appl. No. 15/219,149, filed Jul. 25, 2016. First Named Inventor: Ledenev. Office Action dated Mar. 3, 2017. 14 pages.
Canadian Patent Application No. 2737134, filed Mar. 14, 2008. First Named Inventor: Ledenev. Notice of Allowance dated Feb. 13, 2017. 1 page.
Reissue U.S. Appl. No. 15/469,087, filed Mar. 24, 2017. First Named Inventor: Ledenev.
European Patent Application No. 13877614; Extended European Search Report dated Nov. 7, 2016. 8 pages.
U.S. Appl. No. 15/219,149, filed Jul. 25, 2016. Applicant Initiated Interview Summary. Interview date Apr. 4, 2017. 1 page.
Japanese Patent Application No. 2016-500068, international filing date: Mar. 15, 2013, Office Action dated Mar. 13, 2017 dated Mar. 15, 2016. English Translation of the Official Action. 8 pages.
U.S. Appl. No. 15/612,892, filed Jun. 2, 2017. First Named Inventor: Ledenev.
U.S. Appl. No. 15/679,745, filed Aug. 17, 2017. First Named Inventor: Ledenev.
Chinese Patent Application No. 201310162669.6, 5th Notification of Office Action dated Mar. 20, 2017. 6 pages.
Chinese Patent Application No. 201310162669.6, Decision of Rejection dated Sep. 7, 2017. 8 pages.
Chinese Patent Application No. 201310162669.6, First Office Action dated Nov. 25, 2014. 6 pages.
Chinese Patent Application No. 201310162669.6, Search Report dated Nov. 25, 2014. 2 pages.
Chinese Patent Application No. 201310162669.6, Second Notification of Office Action dated Jul. 17, 2015. 8 pages.
Chinese Patent Application No. 201310162669.6, Third Notification of Office Action dated Jan. 14, 2016. 7 pages.
Chinese Patent Application No. 201310162669.6, Fourth Notification of Office Action dated Aug. 17, 2016. 7 pages.
Canadian Patent Application No. 2702392, Office Action dated Jul. 31, 2014. 2 pages.
Canadian Patent Application No. 2702392, Office Action dated Sep. 26, 2013. 2 pages.
European Patent Application No. 08796302.1, Office Action dated Jun. 28, 2016. 4 pages.
German Patent No. DE4032569A1, published Apr. 16, 1992. Translated from GooglePatent. 7 pages.
Chinese Application No. 201380076592.9, Second Notification of Office Action dated Jul. 28, 2017. 9 pages.
Chinese Application No. 201380076592.9 filed Mar. 15, 2013. First Notification of Office Action and Search Report dated Nov. 28, 2016. 11 pages.
U.S. Appl. No. 15/219,149, filed Jul. 25, 2016. First Named Inventor: Ledenev. Notice of Allowance and Applicant Initiated Interview Summary dated Apr. 26, 2017. 14 pages.
U.S. Appl. No. 15/181,174, filed Jun. 13, 2016. First Named Inventor: Ledenev: Office Action dated Oct. 10, 2017. 12 pages.
European Application No. 17150670.2. Extended European Search Report dated Apr. 7, 2017. 13 pages.
U.S. Appl. No. 15/469,087, filed Mar. 24, 2017. First Named Inventor Ledenev. Applicant-Initiated Interview Summary dated Oct. 20, 2017. 4 pages.
Japanese Patent Application No. 2016-500068. Final rejection dated Sep. 29, 2017. English Translation. 7 pages.
Japanese Patent Application No. 2016-160797. Rejection dated Sep. 29, 2017. 10 pages.
U.S. Appl. No. 15/793,704, filed Oct. 25, 2017. First Named Inventor: Porter.
Japanese Laid-Open Publication No. 2007-325371. Abstract only. 1 page.
U.S. Appl. No. 15/164,806, filed May 25, 2016. First Named Inventor: Anatoli Ledenev. Ex Parte Quayle Action dated Dec. 12, 2017. 8 pages.
U.S. Appl. No. 15/213,193, filed Jul. 18, 2016. First Named Inventor: Ledenev. Office Action dated Jan. 19, 2018. 15 pages.
Vazquez, et al., The Tapped-Inductor Boost Converter. © 2007 IEEE. 6 pages.
European Patent Application No. 17150670.2. Office Action dated Jan. 29, 2018. 9 pages.
Chinese Patent Application No. 201380076592.9. English Translation of the 3rd Notification of Office Action, dated Feb. 7, 2018. 13 pages.
U.S. Appl. No. 15/164,806, filed May 25, 2016. Notice of Allowance dated Mar. 9, 2018. 8 pages.
U.S. Appl. No. 15/164,806, filed May 25, 2016. Corrected filing receipt mailed Mar. 14, 2018. 3 pages.
Japanese Patent Application No. 2016-160797. Rejection dated Mar. 27, 2018. 13 pages.
European Application No. 17209600, Extended European Search Report dated Apr. 10, 2018. 6 pages.
U.S. Appl. No. 15/164,806, filed May 25, 2016. Corrected Notice of Allowance dated May 10, 2018. 4 pages.
TwentyNinety.com/en/about-us/, printed Aug. 17, 2010; 2 pages.
International Patent Application No. PCT/US08/60345. International Prelimianry Report on Patentability dated Aug. 30, 2010; 24 pages.
U.S. Appl. No. 61/252,998, filed Oct. 19, 2009, entitled Solar Module Circuit with Staggered Diode Arrangement; First Named Inventor Ledenev; 55 pages.
U.S. Appl. No. 12/682,882; Nonfinal Office Action dated Sep. 27, 2010; First Named Inventor: Porter; 18 pages.
U.S. Appl. No. 12/682,882; Examiner's Interview Summary dated Oct. 20, 2010; dated Oct. 26, 2010; 4 pages.
U.S. Appl. No. 12/738,068; Examiner's Interview Summary dated Oct. 20, 2010; 2 pages.
U.S. Appl. No. 12/738,068; Nonfinal Office Action dated Nov. 24, 2010; 8 pages.
U.S. Appl. No. 12/682,559; Nonfinal Office Action dated Dec. 10, 2010; 12 pages.
European Patent Application No. 07 873 361.5 Office Communication dated Jul. 12, 2010 and applicant's response dated Nov. 22, 2010; 24 pages.
International Patent Application No. PCT/US2008/079605. International Preliminary Report on Patentability dated Jan. 21, 2011; 7 pages.
Parallel U.S. Appl. No. 12/738,068; Examiner's Interview Summary dated Feb. 3, 2011; 2 pages.
Parallel U.S. Appl. No. 12/682,882; Examiner's Interview Summary dated Feb. 9, 2011; 4 pages.
Parallel U.S. Appl. No. 12/682,559; Examiner's Interview Summary dated Feb. 10, 2011; 3 pages.
International Patent Application No. PCT/US2010/053253. International Search Report and International Written Opinion of the International Searching Authority dated Feb. 22, 2011; 13 pages.
Parallel U.S. Appl. No. 12/682,559; Final Office Action dated Mar. 3, 2011; 13 pages.
U.S. Appl. No. 12/738,068; Notice of Allowance dated Feb. 24, 2011; 25 pages.
U.S. Appl. No. 12/955,704; Nonfinal Office Action dated Mar. 8, 2011; 7 pages.

(56) References Cited

OTHER PUBLICATIONS

U.S. Appl. No. 12/682,882; Final Office Action dated May 13, 2011; 17 pages.
U.S. Appl. No. 12/995,704; Notice of allowance dated Jul. 19, 2011; 5 pages.
International Application No. PCT/US09/41044; International Preliminary Report on Patentability dated Jul. 6, 2011; 14 pages.
U.S. Appl. No. 12/682,882; Notice of allowance dated Sep. 9, 2011; 9 pages.
U.S. Appl. No. 12/682,559; Nonfinal office action dated Sep. 23, 2011; 10 pages.
U.S. Appl. No. 13/275,147; Nonfinal office action dated Dec. 29, 2011; 10 pages.
U.S. Appl. No. 13/059,955; Nonfinal office action dated Jan. 23, 2012; 9 pages.
International Application No. PCT/US10/53253; International Preliminary Report on Patentability dated Jan. 25, 2012; 37 pages.
U.S. Appl. No. 12/682,559; Notice of allowance dated Apr. 17, 2012; 9 pages.
International Application No. PCT/US08/80794; International Preliminary Report on Patentability dated May 8, 2012; 7 pages.
U.S. Appl. No. 13/078,492; Nonfinal office action dated May 16, 2012, 10 pages.
U.S. Appl. No. 13/192,329; Final office action dated Jun. 13, 2012; 13 pages.
CN Patent Application No. 200880121101.7; office action dated Sep. 26, 2011; 6 pages.
CN Patent Application No. 200880121101.7; office action dated Jun. 11, 2012; 3 pages.
U.S. Appl. No. 13/192,329; Notice of Allowance dated Jul. 30, 2012; 5 pages.
International Application No. PCT/2012/022266, International Search Report dated Jul. 24, 2012; 5 pages.
International Application No. PCT/2012/022266, Written Opinion of the International Searching Authority dated Jul. 24, 2012; 16 pages.
Related U.S. Appl. No. 13/275,147; Final office action dated Aug. 24, 2012; 16 pages.
Related Chinese Patent Application No. 200880121009.0, Office Action dated Aug. 31, 2012; 12 pages.
Related U.S. Appl. No. 13/059,955; Final office action dated Sep. 27, 2012; 11 pages.
Parallel SG Patent Application No. 201107477-0; written opinion dated Nov. 27, 2012; 12 pages.
Parallel JP Patent Application No. 2010-529991; office action dated Dec. 14, 2012, 7 pages.
Parallel JP Patent Application No. 2010-529986; office action dated Mar. 5, 2013, 3 pages.
Related U.S. Appl. No. 13/078,492; Notice of Allowance dated Apr. 24, 2013, 10 pages.
Related U.S. Appl. No. 13/275,147; Notice of Allowance dated Jun. 3, 2013, 17 pages.
Related CN Patent Application No. 200880121101.7; Notice of Allowance dated Feb. 17, 2013, 3 pages.
Related Chinese Patent Application No. 200880121009.0, Office Action dated May 31, 2013, 7 pages.
Parallel JP Patent Application No. 2010-529991; office action dated Sep. 5, 2013, 6 pages.
U.S. Appl. No. 13/308,517, filed Nov. 3, 2011, First Named Inventor: Meir Adest.
U.S. Appl. No. 14/550,574, filed Nov. 21, 2014. First Named Inventor: Ledenev. Notice of Allowance dated Jun. 6, 2016; 12 pages.
Miwa, et al. High Efficiency Power Factor Correction Using Interleaving Techniques. (c) 1992 Laboratory for Electromagnetic and Electronic Systems, Massachusetts Institute of Technology. 12 pages.
U.S. Appl. No. 16/440,843, filed Jun. 13, 2019. First Named Inventor: Porter.

All pleadings, orders, exhibits, and any and all other documents in Interference No. 106,112, declared May 31, 2019. All documents available at the USPTO's Interference Portal.
European Patent Application No. 13877614, Communication/Office Action dated Nov. 7, 2019. 4 pages.
U.S. Appl. No. 16/439,430, filed Jun. 12, 2019. First Named Inventor: Porter. Filing Receipt dated Jun. 19, 2019. 4 pages.
U.S. Appl. No. 16/439,430, filed Jun. 12, 2019. First Named Inventor: Porter. Office Action dated Oct. 30, 2019. 39 Pages.
U.S. Appl. No. 16/440,843, filed Jun. 13, 2019. First Named Inventor: Porter. Filing Receipt dated Jun. 21, 2019. 4 pages.
Indian Patent Application No. 1568/NOLNP/2010. Official Communication from the Office dated Oct. 16, 2019. 4 pages.
European Patent Application No. 17150670.2, Communcation/Office Action dated Nov. 8, 2019. 4 pages.
U.S. Appl. No. 16/439,430, filed Jun. 12, 2019. First Named Inventor: Porter.
Solar Sentry Corp., Protecting Solar Investment "Solar Sentry's Competitive Advantage", 4 pages estimated as Oct. 2008.
Anon Source; International Symposium on Signals, Circuits and Systems, Jul. 12-13, 2007; Iasi, Romania; Publisher: Institute of Electrical and Electroncis Engineers Computer Society; Abstract. 1 page.
Bascope, G.V.T.; Barbi, I; "Generation of a Family of Non-isolated DC-DC PWM Converters Using New Three-state Switching Cells;" 2000 IEEE 31st Annual Power Electronics Specialists Conference in Galway, Ireland; vol. 2, Abstract. 1 page.
Bower, et al. "Innovative PV Micro-Inverter Topology Eliminates Electrolytic Capacitors for Longer Lifetime," 1-4244-0016-3-06 IEEE p. 2038 (2006); 4 pages.
Cambridge Consultants, Interface Issue 43, Autumn 2007; 21 pages.
Case, M.J.; "Minimum Component Photovoltaic Array Maximum Power Point Tracker," Vector (Electrical Engineering), Jun. 1999; Abstract. 1 page.
Tse, K.K.et al. "A Novel Maximum Power Point Tracking Technique for PV Panels;" Dept. of Electronic Engineering, City Univerisity of Hong Kong; Source: PESC Record—IEEE Annual Power Electronics Specialists Conference, v 4, 2001, p. 1970-1975, Jun. 17-21, 2001; Abstract. 1 page.
Cuadras, A; Ben Amor, N; Kanoun, O; "Smart Interfaces for Low Power Energy Harvesting Systems," 2008 IEEE Instrumentation and Measurement Technology Conference May 12-15, 2008 in Victoria, BC Canada; Abstract. 1 page.
Dallas Semiconductor; Battery I.D. chip from Dallas Semiconductor monitors and reports battery pack temperature, Bnet World Network, Jul. 10, 1995; 1 page.
De Doncker, R. W.; "Power Converter for PV-Systems," Institute for Power Electrical Drives, RWTH Aachen Univ. Feb. 6, 2006; 18 pages.
De Haan, S.W.H., et al; Test results of a 130W AC module, a modular solar AC power station, Photovoltaic Energy Conversion, 1994; Conference Record of the 24th IEEE Photovoltaic Specialists Conference Dec. 5-9, 1994; 1994 IEEE First World Conference. Abstract, 1 page.
Dehbonei, Hooman; Corp author(s): Curtin University of Technology, School of Electrical and Computer Engineering; 2003; Description: xxi, 284 leaves; ill.; 31 cm. Dissertation: Thesis. Abstract; 1 page.
Jung, D; Soft Switching Boost Converter for Photovoltaic Power Generation System, 2008 13th International Power Electronics and Motion Control Conference (EPE-PEMC 2008); 5 pages.
Duan, Rouo-Yong; Chang, Chao-Tsung; "A Novel High-efficiency Inverter for StAMPT-alone and Grid-connected Systems," 2008 3rd IEEE Conference on Industrial Electronics and Applications in Singapore, Jun. 3-5, 2008; Article No. 4582577. Abstract. 3 pages.
Duncan, Joseph, A Global Maximum Power Point Tracking DC-DC Converter, Massachussetts Institute of Technology, Dept. of Electrical Engineering and Computer Science Dissertation; Jan. 20, 2005; 80 pages.
Edelmoser, K. H. et al.; High Efficiency DC-to-AC Power Inverter with Special DC Interface; Professional Paper, ISSN 0005-1144, Automatika 46 (2005) 3-4, 143-148 6 pages.

(56) References Cited

OTHER PUBLICATIONS

Enrique, J.M.; Duran, E; Sidrach-de-Cadona, M; Andujar, JM; "Theoretical Assessment of the Maximum Power Joint Tracking Efficiency of Photovoltaic Facilities with Different Converter Topologies;" Source: Solar Energy 81, No. 1 (2007); 31 (8 pages).

Enslin, J.H.R.; "Integrated Photovoltaic Maximum Power Point Tracking Converter;" Industrial Electronics, IEEE Transactions on vol. 44, Issue 6, Dec. 1997, pp. 769-773.

Ertl, H; Kolar, J.W.; Zach, F.C.; "A Novel Multicell DC-AC Converter for Applications in Renewable Energy Systems;" IEEE Transactions on Industrial Electronics, Oct. 2002; vol. 49, Issue 5, Abstract. 1 page.

Esmaili, Gholamreza; Application of Advanced Power Electronics in Renewable Energy Sources and Hygrid Generating Systems, Ohio State University, Graduate Program in Electrical and Computer Engineering, 2006, Dissertation. 169 pages.

Gomez, M; "Consulting in the solar power age," IEEE-CNSV: Consultants' Network of Silicon Valley, Nov. 13, 2007; 30 pages.

Guo, G.Z.; "Design of a 400W, 1 Omega, Buck-boost Inverter for PV Applications," 32nd Annual Canadian Solar Energy Conference, Jun. 10, 2007; 18 pages.

Hashimoto et al; "A Novel High Performance Utility Interactive Photovoltaic Inverter System," Department of Electrical Engineering, Tokyo Metropolitan University, 1-1 Miinami-Osawa, Hachioji, Tokyo, 192-0397, Japan; pp. 2255-2260, © 2000.

Ho, Billy M.T.; "An Integrated Inverter with Maximum Power Tracking for Grid-Connected PV Systems;" Department of Electronic Engineering, City University of Hong Kong; Conference Proceedings, 19th Annual IEEE Applied Power Electronics Conference and Exposition, Feb. 22-26, 2004; p. 1559-1565.

http://www.solarsentry.com; Protecting Your Solar Investment, 2005, Solar Sentry Corp. 1 page.

Hua, C et al; "Control of DC-DC Converters for Solar energy System with Maximum Power Tracking," Department of Electrical Engineering; National Yumin University of Science & Technology, Taiwan; vol. 2, Nov. 9-14, 1997; 827-832.

International Application filed Apr. 15, 2008, Serial No. PCT/US08/60345; First Named Inventor: Porter. 87 pages.

International Application filed Jul. 18, 2008, Serial No. PCT/US08/70506; First Named Inventor: Schatz. 137 pages.

International Application filed Mar. 14, 2008, Serial No. PCT/US08/57105; 90 pages.

International Application filed Oct. 10, 2008, Serial No. PCT/US08/79605; 46 pages.

International Application No. PCT/US08/57105, International Search Report dated Jun. 25, 2008; 5 pages.

International Application No. PCT/US08/57105, Written Opinion dated Jun. 25, 2008; 42 pages.

International Application No. PCT/US08/60345, International Search Report dated Aug. 18, 2008; 1 page.

International Application No. PCT/US08/60345, Written Opinion dated Aug. 18, 2008; 10 pages.

International Application No. PCT/US08/70506, International Search Report dated Sep. 26, 2008; 4 pages.

International Application No. PCT/US08/70506, Written Opinion dated Sep. 26, 2008; 7 pages.

Joo, Hyuk Lee; "Soft Switching Multi-Phase Boost Converter for Photovoltaic System," Power Electronics and Motion Control Conference, 2008. EPE-PEMC 2008. 13th Sep. 1, 2008. Abstract only. 1 page.

Kaiwei, Yao, Mao, Ye; Ming, Xu; Lee, F.C.; "Tapped-inductor Buck Converter for High-step-down DC-DC Conversion," IEEE Transactions on Power Electronics, vol. 20, Issue 4, Jul. 2005; Abstract. 1 page.

Kang, F et al; Photovoltaic Power Interface Circuit Incorporated with a Buck-boost Converter and a Full-bridge Inverter; doi:10.1016-j.apenergy.2004.10.009 2 pages.

Kern, G; "SunSine (TM)300: Manufacture of an AC Photovoltaic Module," Final Report, Phases I & II, Jul. 25, 1995-Jun. 30, 1998; National Renewable Energy Laboratory, Mar. 1999; NREL-SR-520-26085; 33 pages.

Kretschmar, K et al; "An AC Converter with a Small DC Link Capacitor for a 15kW Permanent Magnet Synchronous Integral Motor,Power Electronics and Variable Speed Drive," 1998;7th International Conference; Conf. Publ. No. 456; Sep. 21-23, 1998; 4 pages.

Kroposki, H. Thomas and Witt, B & C; "Progress in Photovoltaic Components and Systems," National Renewable Energy Laboratory, May 1, 2000; NREL-CP-520-27460; 7 pages.

Kuo, J.-L.; "Duty-based Control of Maximum Power Point Regulation for Power Converter in Solar Fan System with Battery Storage," Proceedings of the Third IASTED Asian Conference, Apr. 2, 2007, Phuket, Thialand. pp. 163-168.

Lim, Y.H. et al; "Simple Maximum Power Point Tracker for Photovoltaic Arrays," Electronics Letters May 25, 2000; vol. 36, No. 11. 2 pages.

Linear Technology Specification Sheet, LTM4607, estimated as Nov. 14, 2007; 24 pages.

Matsuo, H et al; Novel Solar Cell Power Supply System using the Multiple-input DC-DC Converter; Telecommunications Energy Conference, 1998; INTELEC, 20th International, pp. 797-802.

Mutoh, Nobuyoshi, "A Controlling Method for Charging Photovoltaic Generation Power Obtained by a MPPT Control Method to Series Connected Ultra-electric Double Layer Capacitors;" Intelligent Systems Department, Faculty of Engineering, Graduate School of Tokyo; 39th IAS Annual Meeting (IEEE Industry Applications Society); v 4, 2004, Abstract. 1 page.

Mutoh, Nobuyoshi; A Photovoltaic Generation System Acquiring Efficiently the Electrical Energy Generated with Solar Rays,; Graduate School of Tokyo, Metropolitan Institute of Technology; Source: Series on Energy and Power Systems, Proceedings of the Fourth IASTED International Conference on Power and Energy Systems, Jun. 28-30, 2004; Abstract. 1 page.

Nishida, Yasuyuki, "A Novel Type of Utility-interactive Inverter for Photovoltaic System," Conference Proceedings, IPEMC 2004; 4th International Power and Electronics Conference, Aug. 14-16, 2004; Xian Jiaotong University Press, Xian, China; Abstract. 1 page.

Oldenkamp, H. et al; AC Modules: Past, Present and Future, Workshop Installing the Solar Solution; Jan. 22-23, 1998; Hatfield, UK; 6 pages.

Jung, et al. DC-Link Ripple Reduction of Series-connected Module Integrated Converter for Photovoltaic Systems. International Conference of Power Electronics—ECCE Asia May 30-Jun. 2, 2011. 4 pages.

U.S. Appl. No. 13/503,011, filed Apr. 19, 2012. First Named Inventor: Anatoli Ledenev. Notice of Allowance dated Jun. 29, 2016; 15 pages.

U.S. Appl. No. 13/934,102, filed Jul. 2, 2013. First Named Inventor: Anatoli Ledenev. Notice of Allowance dated Jun. 30, 2016.; 11 pages.

U.S. Appl. No. 13/254,666, filed Sep. 2, 2011. First Named Inventor: Robert M. Porter. Notice of Allowance dated Jul. 14, 2016; 11 pages.

U.S. Appl. No. 15/181,174, filed Jun. 13, 2016. First Named Inventor: Anatoli Ledenev.

U.S. Appl. No. 15/094,803, filed Apr. 8, 2016. First Named Inventor: Robert M. Porter.

U.S. Appl. No. 15/164,806, filed May 25, 2016. First Named Inventor: Anatoli Ledenev.

Japanese Application No. 2004-046358, published Feb. 9, 2005. Filed Feb. 23, 2004. First Named Inventor: Yoshitake Akira. Abstract only. 1 page.

Japanese Application No. 06-318447, filed Dec. 21, 1994. First Named Inventor: Tanaka Kunio. Abstract only. 1 page.

European Application No. 0677749A3, filed Apr. 13, 1995. First Named Inventor: Takehara. Abstract only, 2 pages.

U.S. Appl. No. 13/254,666, filed Sep. 2, 2011. First Named Inventor: Robert M. Porter.

(56) References Cited

OTHER PUBLICATIONS

International Patent Application Publication No. 2009/007782A4, published Jan. 15, 2009. Applicant: SolarEdge Ltd. Abstract and Claims only. 5 pages.
International Patent Application Publication No. 2009/072075A3, published Jun. 11, 2009. Applicant: SolarEdge Ltd. Abstract and Search Report. 4 pages.
European Patent Application No. EP0964457A3, published May 24, 2006. Applicant: Canon Kabushiki Kaisha. Abstract and Search Report. 4 pages.
European Patent Application No. EP0978884A3, published Mar. 22, 2000. Applicant: Canon Kabushiki Kaisha. Abstract and Search Report. 4 pages.
European Patent Application No. EP1120895A3, published May 6, 2004. Applicant: Murata Manufacturing Co., Ltd. Abstract and Search Report. 3 pages.
Japanese Patent No. 05003678A, published Jan. 8, 1993. Applicant: Toshiba F EE Syst KK, et al. Abstract only. 1 page.
Japanese Patent No. 6035555A, published Feb. 10, 1994. Applicant: Japan Storage Battery Co. Ltd. Abstract only. 1 page.
Japanese Patent No. 06141261A, published May 20, 1994. Applicant: Olympus Optical Co. Ltd. Abstract only. 1 page.
Japanese Patent No. 7026849A, published Jan. 27, 1995. Applicant: Sekisui House Ltd. Abstract only. 1 page.
Japanese Patent No. 07222436A, published Aug. 18, 1995. Applicant: Meidensha Corp. Abstract only. 1 page.
Japanese Patent No. 08033347A, published Feb. 2, 1996. Applicant: Hitachi Ltd et al. Abstract only. 1 page.
Japanese Patent No. 08066050A, published Mar. 8, 1996. Applicant: Hitachi Ltd. Abstract only. 1 page.
Japanese Patent No. 08181343A, published Jul. 12, 1996. Applicant: Sharp Corp. Abstract only. 1 page.
Japanese Patent No. 8204220A, published Aug. 9, 1996. Applicant: Mistubishi Electric Corp. Abstract only. 1 page.
Japanese Patent No. 09097918A, published Apr. 8, 1997. Applicant: Canon Inc. Abstract only. 1 page.
Japanese Patent No. 056042365A, published Apr. 20, 1981. Applicant: Seiko Epson Corp. Abstract only. 1 page.
Japanese Patent No. 60027964A, published Feb. 13, 1985. Applicant: NEC Corp. Abstract only. 1 page.
Japanese Patent No. 60148172A, published Aug. 5, 1985. Applicant: Seikosha Co. Ltd. Abstract only. 1 page.
Japanese Patent No. 62154121A, published Jul. 9, 1987. Applicant: Kyocera Corp. Abstract only. 1 page.
Japanese Patent No. 2000020150A, published Jan. 21, 2000. Applicant: Toshiba Fa Syst Eng Corp et al. Abstract only. 1 page.
Japanese Patent No. 2002231578A, published Aug. 16, 2002. Applicant: Meidensha Corp. Abstract only. 1 page.
Japanese Patent No. 07058843A, published Mar. 3, 1995. Applicant: Matsushita Electric Ind. Co. Ltd. Abstract only. 1 page.
Japanese Patent Application No. 2007104872A, published Apr. 19, 2007. Applicant: Ebara Densan Ltd. Abstract only. 1 page.
Japanese Patent Application No. 2007225625A, filed Sep. 6, 2007. Applicant: Ahei Toyoji et al. Abstract only. 1 page.
Japanese Patent Application No. 2001086765A, filed Mar. 30, 2001. Applicant: Powerware Corp. Abstract only. A page.
Korean Patent Application No. 102005-7008700, filed May 13, 2005. Applicant: Exar Corporation. Abstract only. 2 pages.
Korean Patent Application No. 102004-0099601, filed Dec. 1, 2004. Applicant: Lee, Seong Ryong. Abstract only. 2 pages.
Korean Patent Application No. 102007-0036528, filed Apr. 13, 2007. Applicant: Industry-Academic Coop Foundation of Kyungnam Univ. Abstract only. 2 pages.
International Application Publication No. WO2006/013600A3, published Feb. 9, 2006. Applicant: Universita Degli Studi DiRoma "La Sapienza". Abstract and Search Report. 5 pages.
International Application Publication No. 2006/048689A3, published May 11, 2006. Applicant: Enecsys Ltd. Abstract and Search Report. 7 pages.
International Application Publication No. 2009/140551A3, published Nov. 19, 2009. Applicant: National Semiconductor Corp. Abstract and Search Report. 3 pages.
International Application Publication No. 2009/140543A3, published Nov. 19, 2009. Applicant: National Semiconductor Corp. Abstract and Search Report. 4 pages.
International Application Publication No. 2009/140536A3, published Nov. 19, 2009. Applicant: National Semiconductor Corp. Abstract and Search Report. 4 pages.
Japanese Patent No. 09148613A, filed Jun. 6, 1997. Applicant: Sanyo Electric Co Ltd. Abstract only. 1 page.
International Application Publication No. 2010/062662A3, published Jun. 3, 2010. Applicant: Tigo Energy, Inc. Abstract and Search Report. 4 pages.
International Application Publication No. 2009/114341A3, published Sep. 17, 2009. Applicant: Tigo Energy, Inc. Abstract and Search Report. 3 pages.
International Application Publication No. 2009/075985A3, published Jun. 18, 2009. Applicant: Tigo Energy, Inc. Abstract and Search Report. 4 pages.
International Application Publication No. 2009/064683A3, published May 22, 2009. Applicant: Tigo Energy, Inc. Abstract and Search Report. 3 pages.
International Application Publication No. 2009/059028A3, published May 7, 2009. Applicant: Tigo Energy, Inc. Abstract and Search Report. 3 pages.
U.S. Appl. No. 15/793,704, filed Oct. 25, 2017. First Named Inventor: Porter. Notice of Allowance dated Feb. 27, 2019.
U.S. Appl. No. 15/094,803, filed Apr. 8, 2016. First named inventor: Porter. Office Action dated May 2, 2019. 9 pages.
U.S. Appl. No. 15/679,745, filed Aug. 17, 2017. First Named Inventor: Ledenev. Office Action dated May 8, 2019. 23 pages.
Canadian Patent Application No. 2942616, First Named Inventor: Ledenev. Notice of Allowance dated Apr. 8, 2019. 1 page.
U.S. Appl. No. 15/262,916, filed Sep. 12, 2016. Corrected Notice of Allowability dated May 21, 2019. 2 pages.
European Patent Application No. 08796302.1, Office Action dated May 13, 2019. 3 pages.
European Patent Application No. 08732274.9. Communication/Office Action dated May 22, 2019. 3 pages.
European Patent Application No. 17150670.2. Summons to Attend Oral Proceedings and Preliminary Opinion dated Apr. 8, 2019. 13 pages.
Power Article, Aerospace Systems Lab, Washington University, St. Louis, MO; estimated at Sep. 2007; 3 pages.
U.S. Appl. No. 11/333,005, filed Jan. 17, 2006, First Named Inventor Gordon E. Presher, Jr.
Quan, Li; Wolfs, P; "An Analysis of the ZVS Two-inductor Boost Converter Under Variable Frequency Operation," IEEE Transactions on Power Electronics, Central Queensland University, Rockhamton, Qld, AU; vol. 22, No. 1, Jan. 2007; pp. 120-131. Abstract only, 1 page.
Rajan, Anita; "Maximum Power Point Tracker Optimized for Solar Powered Cars;" Society of Automotive Engineers, Transactions, v 99, n Sect 6, 1990, Abstract only, 1 page.
Reimann, T, Szeponik, S; Berger, G; Petzoldt, J; "A Novel Control Principle of Bi-directional DC-DC Power Conversion," 28th Annual IEEE Power Electroncis Specialists Conference, St. Louis, MO Jun. 22-27, 1997; vol. 2, Abstract only, 1 page.
Rodriguez, C; "Analytic Solution to the Photovoltaic Maximum Power Point Problem;" IEEE Transactions of Power Electronics, vol. 54, No. 9, Sep. 2007, 7 pages.
Roman, E et al; "Intelligent PV Module for Grid-Connected PV Systems;" IEEE Transactions of Power Electronics, vol. 53, No. 4, Aug. 2006, 8 pages.
Russell, M.C. et al; "The Massachusetts Electric Solar Project: A Pilot Project to Commercialize Residential PC Systems," Photovoltaic Specialists Conference 2000; Conference Record of the 28th IEEE; Abstract Only, 1 page.
SatCon Power Systems, PowerGate Photovoltaic 50kW Power Converter System; Spec Sheet; Jun. 2004, 2 pages.

(56) References Cited

OTHER PUBLICATIONS

Schekulin, Dirk et al; "Module-integratable Inverters in the Power-Range of 100-400 Watts," 13th European Photovoltaic Solar Energy Conference, Oct. 23-27, 1995; Nice, France; p. 1893-1896.
Shimizu, et al; "Generation Control Circuit for Photovoltaic Modules," IEEE Transactions on Power Electronics; vol. 16, No. 3, May 2001. 8 pages.
Siri, K; "Study of System Instability in Current-mode Converter Power Systems Operating in Solar Array Voltage Regulation Mode," Dept. of Electrical and Electronic Systems, Aerospace Corp., El Segundo, CA; Feb. 6-10, 2000 in New Orleans, LA, 15th Annual IEEE Applied Power Electronics Conference and Exposition, Abstract only, 1 page.
solar-electric.com; Northern Arizona Wind & Sun, All About MPPT Solar Charge Controllers; Nov. 5, 2007, 4 pages.
Takahashi, I. et al; "Development of a Long-life Three-phase Flywheel UPS Using an Electrolytic Capacitorless Converter-inverter," 1999 Scripta Technica, Electr. Eng. Jpn, 127(3); 6 pages.
United States Provisional Application filed Dec. 6, 2006, U.S. Appl. No. 60/868,851, first named Inventor: Adest.
United States Provisional Application filed Dec. 6, 2006, U.S. Appl. No. 60/868,893; First Named Inventor: Adest.
United States Provisional Application filed Dec. 7, 2006, U.S. Appl. No. 60/868,962; First Named Inventor: Adest.
United States Provisional Application filed Mar. 26, 2007, U.S. Appl. No. 60/908,095; First Named Inventor: Adest.
United States Provisional Application filed May 9, 2007, U.S. Appl. No. 60/916,815; First Named Inventor: Adest.
United States Provisional Application filed Nov. 15, 2007, U.S. Appl. No. 60/986,979; First Named Inventor: Ledenev.
United States Provisional Application filed Oct. 15, 2007, U.S. Appl. No. 60/980,157; First Named Inventor: Ledenev.
United States Provisional Application filed Oct. 23, 2007, U.S. Appl. No. 60/982,053; First Named Inventor: Porter.
Walker, G.R. et al; "Cascaded DC-DC Converter Connection of Photovoltaic Modules," IEEE Transactions of Power Electronics, vol. 19, No. 4, Jul. 2004, 10 pages.
Walker, G.R. et al; "PV String Per-Module Power Point Enabling Converters," School of Information Technology and Electrical Engineering; The University of Queensland, presented at the Australasian Universities Power Engineering Conference, Sep. 28-Oct. 1, 2003 in Christchurch; AUPEC2003; 6 pages.
Wang, Ucilia; Greentechmedia; "National semi casts solarmagic;" www.greentechmedia.com; Jul. 2, 2008; 3 pages.
Xue, John, "PV Module Series String Balancing Converters," Supervised by Geoffrey Walker, Nov. 6, 2002; University of Queensland, School of Information Technology and Electrical Engineering; 108 pages.
Yuvarajan, S; Dachuan, Yu; Shanguang, Xu; "A Novel Power Converter for Photovoltaic Applications," Journal of Power Sources, Sep. 3, 2004; vol. 135, No. 1-2, pp. 327-331.
Feuermann, D. et al., Reversible low solar heat gain windows for energy savings. Solar Energy vol. 62, No. 3, pp. 169-175, 1998.
Román, E., et al. Experimental results of controlled PV module for building integrated PV systems; Science Direct; Solar Energy, vol. 82, Issue 5, May 2008, pp. 471-480.
Linares, L, et al. Improved Energy Capture in Series String Photovoltaics via Smart Distributed Power Electronics; Proceedings APEC 2009: 24th Annual IEEE Applied Power Electronics Conference. Washington, D.C., Feb. 2009; 7 pages.
Chen, J., et al. Buck-Boost PWM Converters Having Two Independently Controlled Switches, IEEE Power Electronics Specialists Conference, Jun. 2001, vol. 2, 6 pages.
Chen, J., et al. A New Low-Stress Buck-Boost Converter for Universal-Input PFC Applications, IEEE Applied Power Electronics Conference, Feb. 2001; 7 pages.
Walker, G. et al. PhotoVoltaic DC-DC Module Integrated Converter for Novel Cascaded and Bypass Grid Connection Topologies—Design and Optimisation, 37th IEEE Power Electronics Specialists Conference / Jun. 18-22, 2006, Jeju, Korea; 7 pages.

Esram, T., Chapman, P.L., "Comparison of Photovoltaic Array Maximum Power Point Tracking Techniques," Energy Conversion, IEEE Transactions, Vo. 22, No. 2, pp. 439-449, Jun. 2007.
Knaupp, W. et al., Operation of a 10 kW PV facade with 100 W AC photovoltaic modules, 25th PVSC; May 13-17, 1996; Washington, D.C.; 4 pages.
Schoen.T. J. N., BIPV overview & getting PV into the marketplace in the Netherlands, The 2nd World Solar Electric Buildings Conference: Sydney Mar. 8-10, 2000; 15 pages.
Stern M., et al. Development of a Low-Cost Integrated 20-kW-AC Solar Tracking Subarray for Grid-Connected PV Power System Applications—Final Report, National Renewable Energy Laboratory, Jun. 1998; 41 pages.
Verhoeve, C.W.G., et al., Recent Test Results of AC-Module inverters, Netherlands Energy Research Foundation ECN, 1997; 3 pages.
International Application No. PCT/US08/57105, International Preliminary Report on Patentability, dated Mar. 12, 2010; 44 pages.
International Application No. PCT/US08/70506 corrected International Preliminary Report on Patentability, dated Jun. 25, 2010; 12 pages.
International App. No. PCT/US09/41044, Search Report dated Jun. 5, 2009; 3 pages.
International App. No. PCT/US09/41044, Written Opinion dated Jun. 5, 2009; 13 pages.
International App. No. PCT/US08/79605, Search Report dated Feb. 3, 2009; 3 pages.
International App. No. PCT/US08/79605, Written Opinion dated Feb. 3, 2009; 6 pages.
International App. No. PCT/US08/80794, Search Report dated Feb. 23, 2009; 3 pages.
International App. No. PCT/US08/80794, Written Opinion dated Feb. 23, 2009; 7 pages.
National Semiconductor News Release—National semiconductor's SolarMagic Chipset Makes Solar Panels "Smarter" May 2009; 3 pages.
SM3320 Power Optimizer Specifications; SolarMagic Power Optimizer, Apr. 2009; 2 pages.
U.S. Appl. No. 15/164,806, filed May 25, 2016. First Named Inventor: Ledenev. Corrected Notice of Allowability dated Jun. 25, 2018. 2 pages.
U.S. Appl. No. 15/213,193, filed Jul. 18, 2016. First Named Inventor: Ledenev. Notice of Allowance dated Jul. 6, 2018. 12 pages.
U.S. Appl. No. 15/262,916, filed Sep. 12, 2016. First Named Inventor: Porter. Office Action dated Jul. 27, 2018. 8 pages.
Chinese Patent Application No. 201380076592.9. English Translation of the 4th Notification of Office Action, dated Jul. 18, 2018. 2 pages.
U.S. Appl. No. 15/793,704, filed Oct. 25, 2017. First Named Inventor: Porter. Office Action dated Sep. 17, 2018. 10 pages.
U.S. Appl. No. 15/094,803, filed Apr. 8, 2016. First Named Inventor: Porter. Restriction Requirement dated Sep. 10, 2018. 6 pages.
European Patent Application No. 17150670.2. Office Action dated Sep. 10, 2018. 7 pages.
U.S. Appl. No. 15/213,193, filed Jul. 18, 2016. Corrected Notice of Allowability dated Oct. 5, 2018. 2 pages.
Canadian Patent Application No. 2942616, First Named Inventor: Ledenev. Requisition by the Examiner dated Sep. 21, 2018. 5 pages.
European Patent Application No. 08732274.9. Communcation/Office Action dated Nov. 13, 2018. 4 pages.
Japanese Patent Application No. 2016-160797. Penultimate office action dated Oct. 31, 2018. 3 pages.
Indian Patent Application No. 3419/KOLNP/2015, filed Oct. 14, 2015. Examination Report dated Dec. 28, 2018. 9 pages.
Chinese Patent Application No. 201380076592.9. Notice of Decision of Granting Patent Right for Invention dated Jan. 10, 2019.
U.S. Appl. No. 15/612,892, filed Jun. 2, 2017. First Named Inventor: Ledenev. Office Action dated Dec. 4, 2018. 17 pages.
U.S. Appl. No. 15/262,916, filed Sep. 12, 2016. Notice of Allowance dated Feb. 1, 2019. 8 pages.
U.S. Appl. No. 15/679,745, filed Aug. 17, 2017, first named Inventor: Ledenev. Notice of Allowance dated Feb. 12, 2020.

(56) References Cited

OTHER PUBLICATIONS

European Patent Application No. 17209600.0, Communication pursuant to Article 94(3) EPC, dated Feb. 7, 2020. 5 pages.
U.S. Appl. No. 15/679,745, filed Aug. 17, 2017, first named Inventor: Ledenev. Issue Notification dated Feb. 12, 2020. 1 page.
Interference No. 106,112, declared May 31, 2019. Judgment entered Mar. 25, 2020. 4 pages.
Interference No. 106,112, declared May 31, 2019. Decision on Motions entered Mar. 25, 2020. 37 pages.
European Patent Application No. 17150670.2, Communication re: Intention to Grant dated Dec. 5, 2019. 38 pages.
European Patent Application No. 08796302.1, Communication pursuant to Article 94(3) EPC, dated Dec. 4, 2019. 4 pages.
European Patent Application No. 13877614, Communication/Office Action dated Oct. 31, 2019. 3 pages.
Interference No. 106,054, declared Jun. 1, 2016. Judgment—Bd. R. 127(a) entered Dec. 31, 2019. 4 pages.
Interference No. 106,054, declared Jun. 1, 2016. Decision on Motions entered Dec. 31, 2019. 37 pages.
U.S. Appl. No. 16/439,430, filed Jun. 12, 2019. First Named Inventor: Porter. Office Action dated May 14, 2020. 41 pages.

DC POWER CONVERSION CIRCUIT

CROSS-REFERENCES TO RELATED APPLICATIONS

This application is a continuation application of U.S. Non-Provisional application Ser. No. 15/164,806, filed 25 May 2016, now issued as U.S. Pat. No. 10,032,939, which is a continuation application of U.S. Non-Provisional application Ser. No. 13/503,011, filed 19 Apr. 2012, now issued as U.S. Pat. No. 9,466,737, which is the United States National Phase of international patent application number PCT/US2010/053253, filed 19 Oct. 2010, published on 28 Apr. 2011 as WO 2011/049985 A1 and which claims priority to U.S. Provisional App. No. 61/253,025, filed 19 Oct. 2009, each application hereby incorporated herein in their entirety by reference.

TECHNICAL FIELD

This invention relates to methods and apparatus involving grid- or electrical power network-tied photovoltaic (PV) converters. In one embodiment, it especially relates to multiple panel grid-tied PV converters commonly deployed in either commercial or even residential power installations.

BACKGROUND

Many common PV converters may have challenges to meet cost and reliability challenges. Such challenges need to be viewed from the perspective of generating their electricity savings for payback of initial investment over longer periods. The present invention provides systems that may in some embodiments address cost and reliability goals for many PV systems.

At the current time the use of PV (photovoltaic) panels to generate electricity may be in a period of rapid growth. The cost of solar power may even be decreasing and many factors appear to limit the growth of non-renewable energy sources. Today there are both large scale systems and small-scale systems being deployed. In a typical system, many PV panels may be connected to a grid-tied converter or inverter which may take the power from the PV panels, perhaps at or near their maximum power points, and may then transforms it to AC power suitable to back-feeding the grid or other electrical power network.

SUMMARY OF THE INVENTION

This invention solves one fundamental disadvantage of string converters when compared to module level converters. In solar PV installations there are various architectures which address the need for allowing solar PV modules to operate at their Maximum Power Point (MPP). Conventional central inverters 1 operate with their input voltage controlled to find the MPP of an array. This array typically has several (to hundreds or thousands) of strings 2 of individual solar modules 3. But every module has an individual MPP and an array MPP solution leaves energy unharvested. At the other end of the spectrum MPP per module converters allow maximum harvesting from each module. There is a middle ground being considered today whereby each string is equipped with a DC/DC converter operating at the MPP for a series string of PV modules 5.

For certain modules (e.g., thin film modules), the ratio of $V_{OC}$ cold to $V_{MPP}$ hot may be 2:1. Take for example a module having $V_{OC}$ cold=70 volts and hot=35 volts. In this installation the rail voltage on a cold day when the inverter is not connected to the grid will be 70×8=560 volts. This is safely below the US regulatory limit of 600 volts. A conventional string converter could simply be connected to this string. Obviously it would not meet the same regulatory limit with a conventional system if more modules were added to this string.

The normal operating voltage of this string though may be only 35×8=280 volts. This low operating voltage requires a large wire plus the inverter must operate at 280 volts while being able to withstand 560 volts. The circuit of an embodiment of this invention capitalizes on the situation where thin film solar PV modules typically operate with $V_{MPP}$ of, less than, and perhaps only about half of, $V_{OC}$ cold.

One advantage is that string MPP architectures gain much of the energy of individual module MPP architectures while costing a bit less. There are a few limitations of string MPP architectures:

The harvesting is less compared to MPP/module as current may vary within a string which cannot be corrected.

Diagnostic information is only available at the string level instead of module level.

During periods when the downstream inverter is not able to deliver power, the string voltage moves to the open circuit voltage of each module added together. This limits the number of modules which may be connected in a string for a given regulatory voltage level.

The string inverter must operate over a wide input voltage range.

A novel string DC/DC converter with MPP can be used to solve the third limitation while adding several new benefits. Solving this modules-per-string problem allows a solar PV system designer to place more modules per string (perhaps 2× more), resulting in fewer strings and fewer combiner boxes. The final result can be a lowering of Balance Of System (BOS) cost. As will be seen the architecture disclosed also allows a DC/DC converter to operate at its sweet spot improving efficiency. Another aspect of this invention is the suitability of this architecture for thin film photovoltaic modules in that it can address the low fill factor of thin film technologies with a low cost, highly efficient design.

One advantage of the inventive technology may be, in embodiments, the ability to place more modules on a string, thereby lowering the total number of strings that a solar array must have to generate a design power. Such reduction of the total number of strings translates into a cost savings, as strings often require expensive componentry (e.g., combiner boxes). In some embodiments, twice as many solar panels may be placed on a string, relative to conventional technologies.

Additional Exemplary Advantages: Because of the allowed regulatory upper limit voltage (recall that even during an open circuit, during sunlight hours, where no power is output from the DC-AC inverter, there is a voltage output), and because of the fact that typically, an open circuit voltage from a solar panel is greater than a loaded (e.g., operating circuit) voltage from that solar panel (because MPP controls effective during loaded circuit conditions reduce output voltages as compared with open circuit conditions, in order to achieve maximum power), the number of solar panels per string in certain prior art string architecture was limited by the open circuit condition (again, because it produces higher voltages and because compliance with applicable voltage regulations is mandatory), with the inventive technology, the number of modules per string can be increased. This may be due to the bucking of open circuit voltages (which are typically higher than operational voltages); in this way, relative to a conventional apparatus with a maximum number of panels in a string, during open circuit condition, more panels can be added without going over the limit. And during operation, the voltage sum of the loaded panels of a single string can be greater than it otherwise would be (which is beneficial because such means more power per string . . . and the associated cost savings). This may be due to the fact that in embodiments of the inventive technology, the converter, established intermediately within the string, is connected with two portions of the string in which it is established via conductors, and the loaded circuit (e.g., MPP) voltages of such conductors sum to be substantially equal to the output from the converter. Such "sweet spot" operation affords additional efficiency of operation benefits relative to conventional apparatus. As such, not only does the inventive technology, in particular embodiments, offer advantages relative to an increase in the number of modules per string, but it also offers benefits relative to the efficiency of operation (due to "sweet spot" operation). Open circuit voltages may be reduced, or bucked, by the converter, such that they sum to at or below the maximum regulatory voltage. Of course, additional advantages may be as disclosed elsewhere in this patent application.

DESCRIPTION OF PREFERRED EMBODIMENTS

Figure 1:
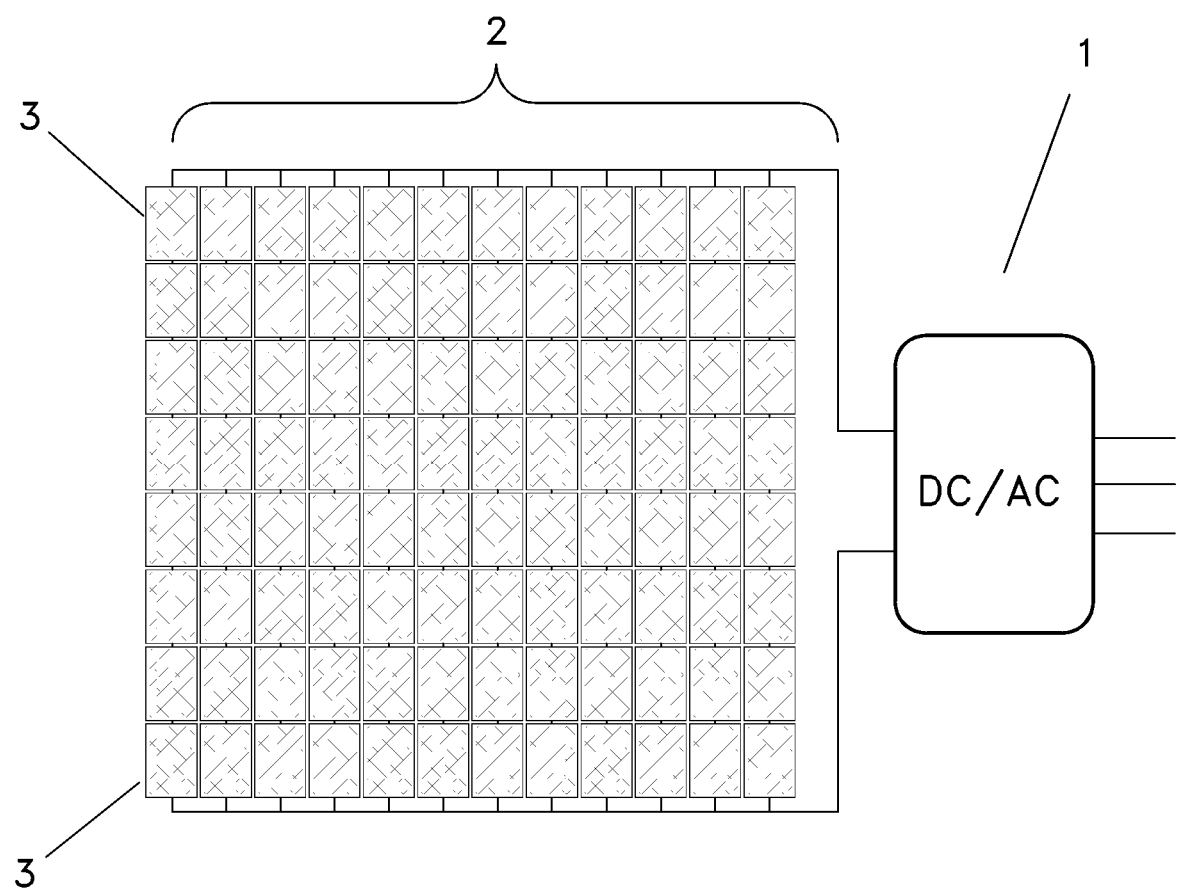
FIG. 1 is a schematic diagram of one type of traditional system grid-tied solar power system with an inverter.
Figure 2:
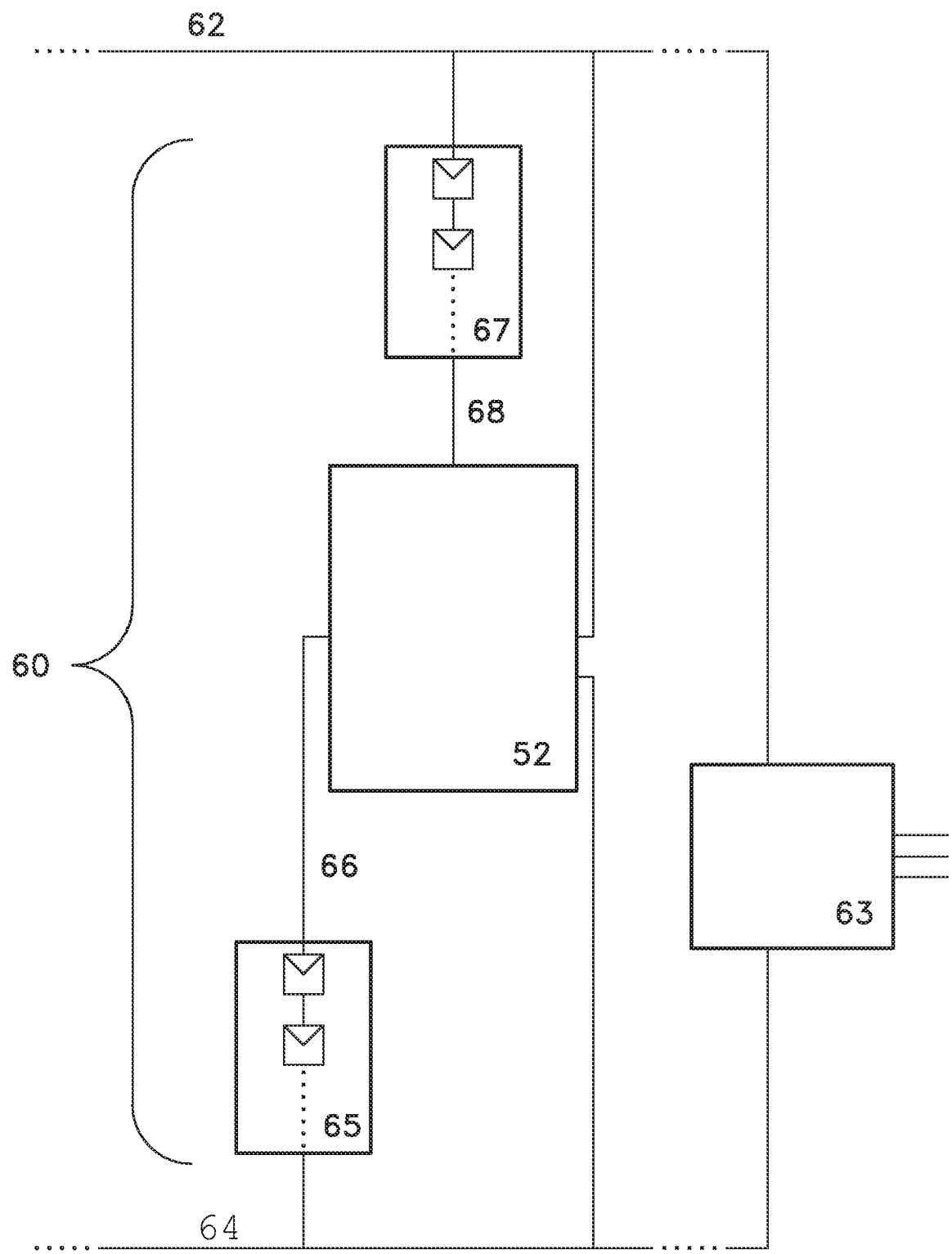
FIG. 2 shows a conceptual embodiment of the invention.

As may be understood from the earlier discussions, the present invention includes a variety of aspects, which may be combined in different ways. The following descriptions are provided to list elements and describe some of the embodiments of the present invention. These elements are listed with initial embodiments, however it should be understood that they may be combined in any manner and in any number to create additional embodiments. The variously described examples and preferred embodiments should not be construed to limit the present invention to only the explicitly described systems, techniques, and applications. Further, this description should be understood to support and encompass descriptions and claims of all the various embodiments, systems, techniques, methods, devices, and applications with any number of the disclosed elements, with each element alone, and also with any and all various permutations and combinations of all elements in this or any subsequent application Consider first the architecture and circuit diagram of one embodiment of the invention shown in FIG. 4. This circuit has two of the former strings 5 combined into a power converter 52 and having a series diode 72, all making up a new string 60. The power converter can have a controlled intra-string connector 9, and in a preferred embodiment, two DC/DC converters 55 (the upper box and the lower box; subconverters 52) perhaps appearing to operate in a mirror image of each other, among other options. During periods of no load, when the downstream inverter is not connected to the grid, each of the DC/DC subconverters may operate in buck mode and reduce the string input voltage perhaps by about one half. At this time, for example, each DC/DC subconverter 55 may have a $V_{OC}$ input as high as 560 volts but an output of 280 volts. One may see that even though twice as many modules are connected in this string, the output voltage may remain at 560 volts, even when the individual modules are operating at $V_{OC}$. There is little efficiency penalty for the DC/DC inverter at this time as there is no power being processed.

During power generating periods (loaded circuit condition), when individual module outputs may drop to $V_{MPP}$, (the series of eight modules making perhaps ~280 volts) the DC/DC subconverter 55 may now pass the input voltage relatively unaltered to the output which may remain at 560 volts (conservatively below an upper maximum allowed by regulation of 600V). Importantly at this time when the DC/DC subconverters 55 are operating at significant power, they are also at their sweet spot—neither boosting nor bucking significantly and therefore operate at their highest efficiency!

Figure 3:
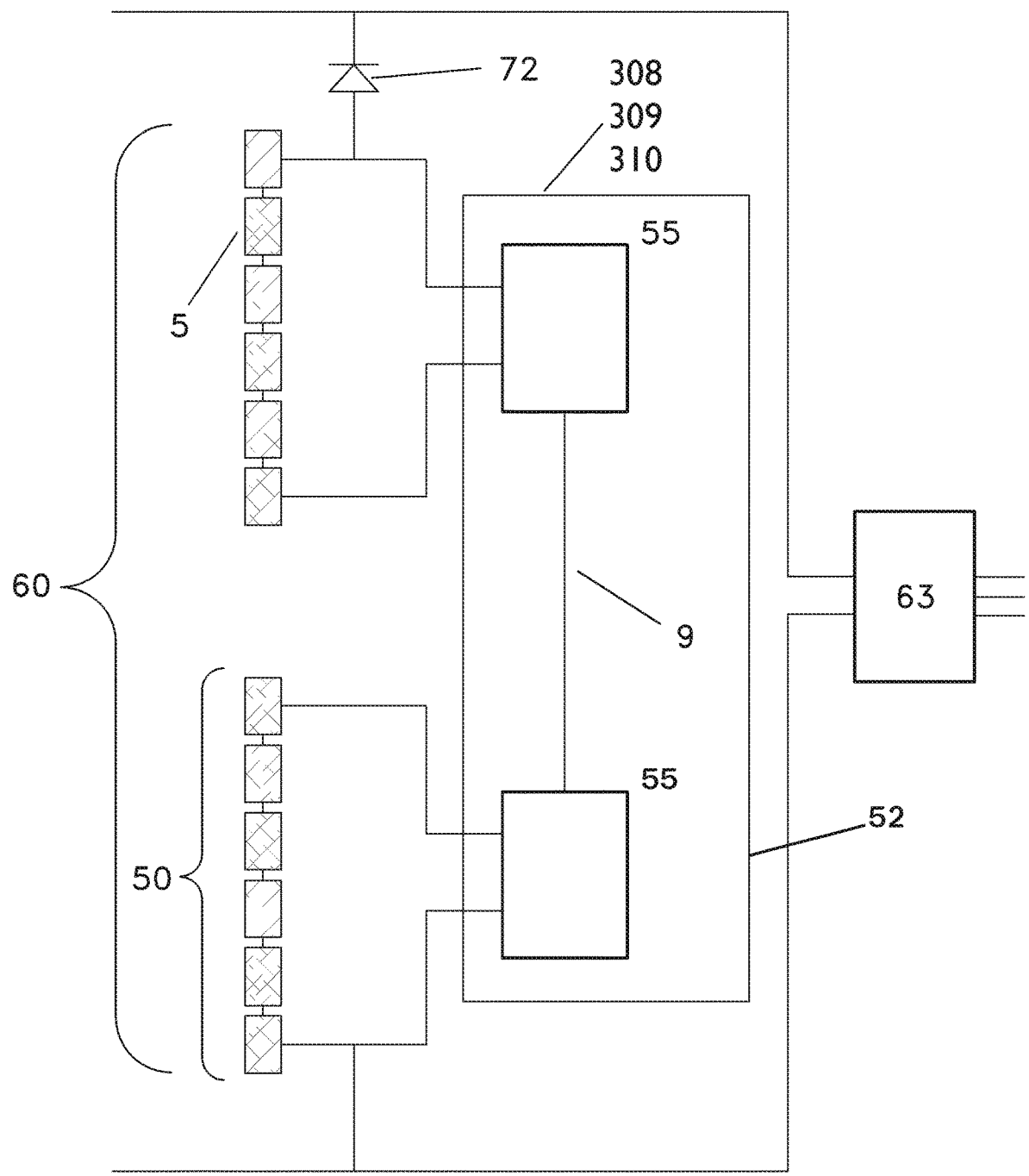
FIG. 3 shows one conceptual embodiment of the invention.
Figure 4:
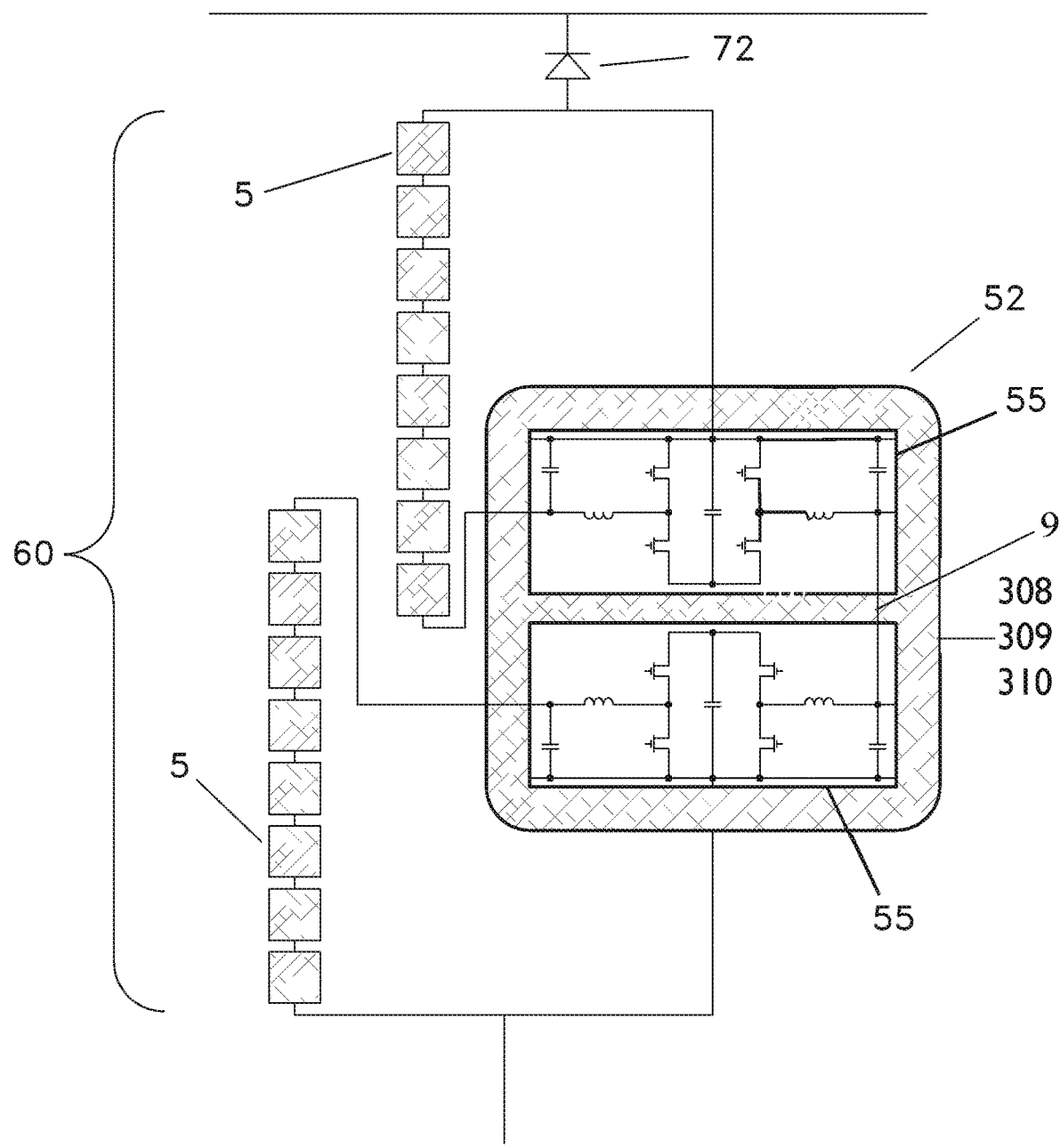
FIG. 4 shows a schematic of one embodiment of the invention.

The DC/DC subconverters 55 may be simply buck mode converters or may be many differing types of converters. This disclosure does not intend to limit aspects of the actual power converter or other element that may be used. For example, as shown conceptually in FIG. 3, embodiments may include: a circuit which divides voltage 308, a coupled inductor circuit, a simple switch perhaps across one or more DC/DC subconverters, a circuit having switching capability 309, an intra-string control element 310, a controllable intra-string connection 9, other designs for DC/DC converters, various circuits which may or may not include MPP/string capabilities, or even any circuit which apportions voltages between strings. Various embodiments may result in different operating conditions and/or operational ranges. One preferred embodiment may be dual mode converters perhaps such as shown in FIG. 4. For a detailed circuit operation for an embodiment of a dual mode DC/DC converter one may refer to PCT publication number WO2009051853 and U.S. Pat. No. 7,605,498. These converters may or may not include P & O MPP tracking for the string—even more, this circuit could provide MPP tracking for each half string, extremely high efficiency, and programmable voltage and current limits.

As a result the circuit and architecture of embodiments of the invention may provide the following benefits:
 Substantially more modules may be included in a string—reducing BOS cost. In the example of FIG. 3, there are twice as many modules in a string.
 This circuit may provide MPP tracking for each half string improving harvesting or conventional string converters.

This circuit can greatly simplify a downstream inverter by providing constant or a narrow range of operating voltage for the inverter.

This circuit may operate at the highest possible efficiency by typically operating with input voltage near output voltage for each DC/DC converter.

This circuit may make use of extremely high efficiency converters, perhaps as described in PCT publication number WO2009051853 and U.S. Pat. No. 7,605,498.

While individual modules operate at VMPP, the string output and the array may operate at much higher voltage limited only by the regulatory environment.

This circuit simultaneously operates at a high efficiency while delivering power at the highest allowable string voltage.

There is no point in the array which exceeds the regulatory voltage limit.

The inventive technology, in embodiments, may adjust loaded condition power per string or even per substring (string portion 50) to achieve maximum power point for that string or substring, while bucking open circuit voltages. Indeed, in particular embodiments, the purpose of the converter may be, at least in part, to extract, perhaps using switches (e.g., perhaps one for each string or substring), maximum power from the string or substrings with which it is connected, while bucking open circuit voltages to provide for a greater number of panels for each string (or substring). While the converters disclosed herein may be, at times, presented in the context of solar array power generation, they may have other applications.

In particular embodiments of the inventive technology, a DC-DC converter 52 may be established intermediately within a string of solar panels (which includes but is not limited to directly in the center of). While in certain embodiments a converter so established may be established such that the number of solar panel(s) serially connected between the converter and the lower rail is the same as the number of panels serially connected between the converter and the upper rail, such a symmetric architecture is not a necessary feature.

Figure 5:
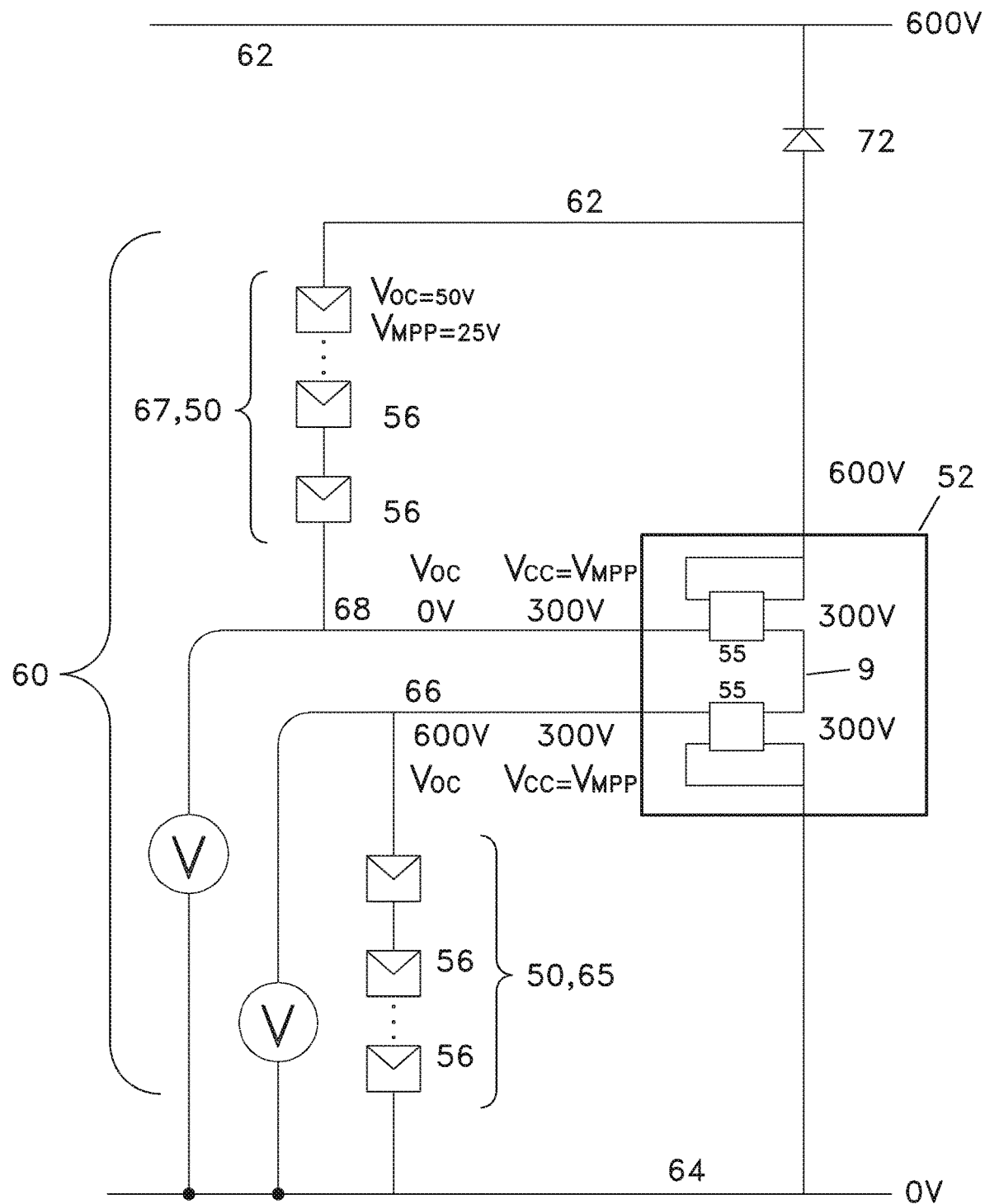
FIG. 5 shows a schematic of one embodiment of the invention, showing loaded circuit voltages (Vcc), or Vmpp (maximum power point), and open circuit voltages (Voc) of various conductors/components. The voltmeter hookups are shown to illustrate where the Voc of 0V, 600V and the Vcc measurements of 300V are taken. Here, a maximum output voltage on rail 62 is 600V.
Figure 6:
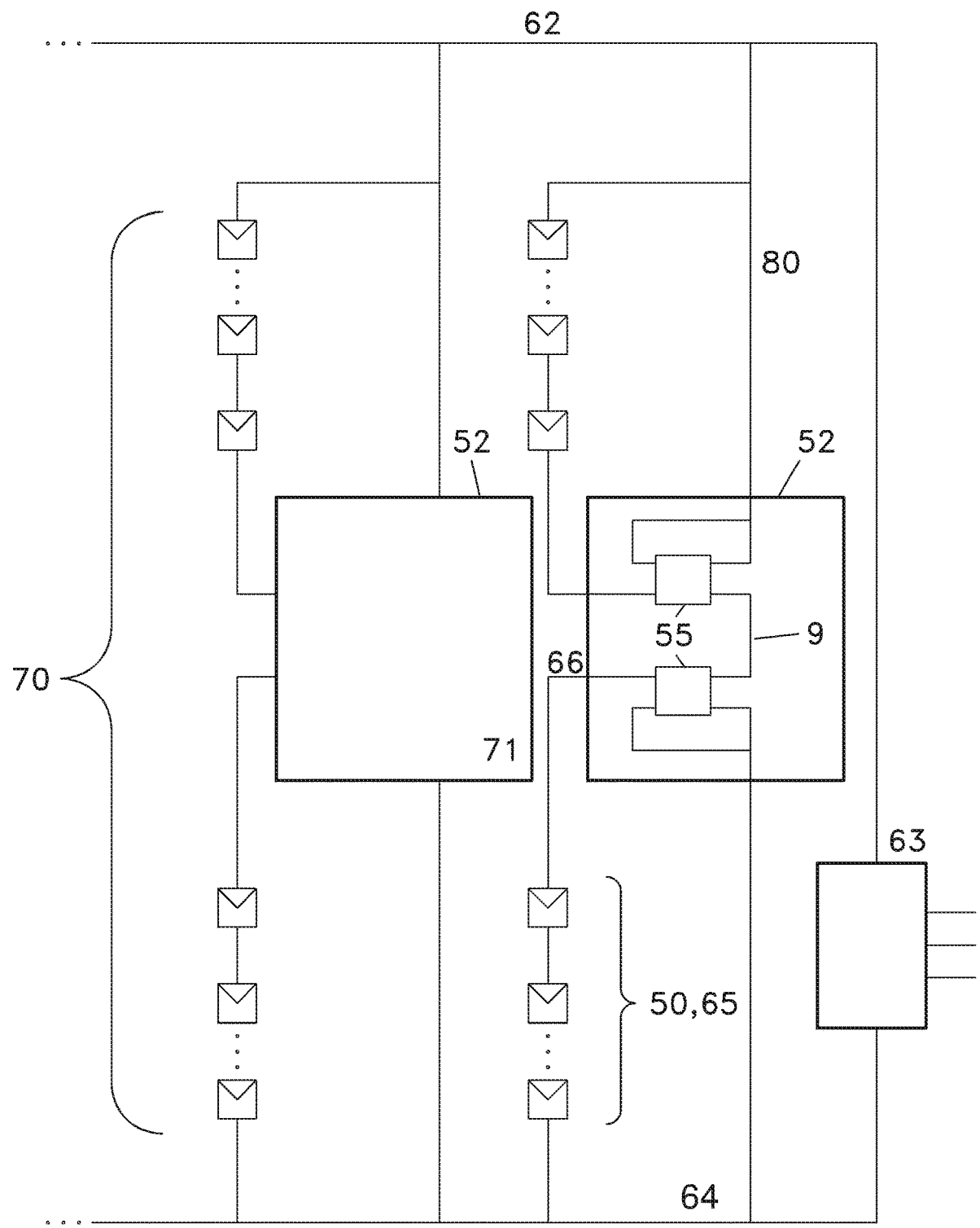
FIG. 6 shows a schematic of one embodiment of the invention.

Particular embodiments may involve operation of the converter at a "sweet spot", where the sum of the voltages of conductors from string portions to the converter is substantially equal to (e.g., within 20% of) the voltage of the conductor leading to the upper (or positive) rail (voltages measured relative to a lower or negative rail; see FIG. 5). Operational efficiencies inhere in "sweet spot" operation; indeed, as but one example, a converter that takes an input of 300 volts and outputs 600 volts is less efficient than a converter that, operating at its "sweet spot", takes an input of 600 volts and outputs 600 volts (or substantially 600 volts, wherein 600 volts is the allowable limit, also expressed as the maximum regulatory voltage) (see, e.g., FIG. 5). In particular embodiments, the output from the converter may be at or close to (e.g., slightly below, or conservatively below), a regulatory limit.

Relatedly, the inventive technology, in particular embodiments, may be viewed as power architecture that allows a substantially constant voltage applied to a positive rail during open circuit and loaded circuit conditions (i.e., where the open circuit voltage of the positive rail relative to the negative rail is substantially equal to the loaded circuit voltage of the positive rail relative to the negative rail), and/or that affords the efficiency benefits of sweet spot converter operation while perhaps also outputting a near maximum regulatory voltage (see, e.g., FIG. 5). It should be understood that particular features of certain embodiments of the inventive technology may not be critical to, and may not be found in, all embodiments. For example, "sweet spot" operation might not be found in all types of converters used in the inventive technology.

In particular embodiments, the intermediately connected DC-DC converter may include sub-converters 55. Where two sub-converters are present, a first string portion may be electrically connected with one sub-converter and a second string portion may be electrically connected with the other sub-converter. The subconverters may be connected with an intra-string connector 9. The converter, regardless of whether it includes sub-converters, may be a buck/boost converter (e.g., a dual mode conductor as described in PCT publication number WO2009051853 and U.S. Pat. No. 7,605,498). Indeed the sub-converters themselves may be "dual mode" type as these references describe.

In particular embodiments where an intermediately established converter divides a solar panel string into two portions, the two string portions may operate as if in parallel during an open circuit condition and operate in as if in series during a closed (operating, e.g., MPP) circuit condition. Further, in particular embodiments, converter circuitry (e.g., switching circuitry), may be able to smoothly transition from series connected substrings (string portions) to parallely connected substrings.

It should be understood that while the exemplary disclosure (e.g., in writing and/or figures) may appear to relate most particularly to unipolar designs, this application is intended to, and in fact does, also disclose bipolar designs (e.g., where the negative, or lower rail has a voltage of zero).

At least one embodiment of the inventive technology may be generally described as a solar power system that includes: at least two solar panels 56 of a first solar power string 60; a first DC-DC converter 52 connected within the first solar power string; a negative rail 64 electrically connected with one of the at least two solar panels and the first DC-DC converter; a positive rail 62 electrically connected with a different one of the at least two solar panels and the first DC-DC converter; and a DC-AC power inverter 63 that acts on power conducted by the negative and positive rails. Often, a rail receives a plurality of inputs from parallely disposed components.

In particular embodiments the first DC-DC converter may operate at a sweet spot during loaded circuit condition of the system. More particularly, the first DC-DC converter connected within the first solar power string may be connected with a first portion 67 of the first solar power string through a first string portion conductor 68 and connected with a second portion 65 of the first solar power string through a second string portion conductor 66, where the second string portion conductor may have a second string portion loaded circuit voltage value (e.g., 600V, including slightly less than 600V) relative to the negative rail, the first string portion conductor may have a first string portion loaded circuit voltage value (e.g., 300V) relative to the negative rail, and a sum of the first string portion loaded circuit voltage value and the second string portion loaded circuit voltage value may be substantially equal to a loaded circuit voltage value 600V of the positive rail relative to the negative rail.

In particular embodiments, the system may further comprise a second solar power string 70 connected in parallel with the first solar power string; and a second DC-DC converter 71 connected may be established within the second solar power string. A diode 72 may be established between the positive rail and the converter.

The positive rail may have an open circuit voltage (e.g., 600V) relative to the negative rail and a loaded circuit voltage relative to the negative rail that are substantially equal. The positive rail may have a loaded circuit voltage relative to the negative rail that is conservatively close (such that expected variations in operating conditions will not cause an excessive voltage) to a regulatory maximum voltage limit (e.g., 560V).

In particular embodiments, the first DC-DC converter may include two sub-converters 55. At least one of the two sub-converters may be a dual mode converter; at least one of the two sub-converters may be a buck converter; and/or at least one of the two sub-converters may be a converter that is neither dual mode, buck, nor boost. Typically, a strictly boost converter would not be applicable, as there may be no need for boosting in converters of certain embodiments of the invention.

It is of note that in certain embodiments, the negative rail (where the rail can have either a negative or zero voltage value), is a lower rail, and the positive rail is an upper rail. Further, the power system can be unipolar or bipolar.

At least one embodiment of the inventive technology may be generally described as a solar power system comprising a string of solar panels 60; a DC-DC converter 52 intermediately connected within the string as a part of the string; a positive rail 62 and a negative rail 64 with which each the string and the DC-DC converter is connected; and at least one DC-AC power inverter 63 that acts on DC power conducted by the positive and negative rails.

In particular embodiments, the first DC-DC converter may operate at a sweet spot during loaded circuit condition of the system. More particularly, the first DC-DC converter connected within the string may be connected with a first portion of the string through a first string portion conductor and connected with a second portion of the string through a second string portion conductor, where the first string portion conductor has a first string portion loaded circuit voltage value relative to the negative rail, the second string portion conductor has a second string portion loaded circuit voltage value relative to the negative rail, and a sum of the first string portion loaded circuit voltage value and the second string portion loaded circuit voltage value is substantially equal to a loaded circuit voltage value of the positive rail relative to the negative rail.

The string may be a first string, and the system may further comprise at least one additional string 70 of solar panels connected in parallel with the first string. The system may further comprise at least one additional DC-DC converter 71, each of which may be connected within one of the at least one additional string of solar panels.

A diode may be established between the DC-DC converter and the positive rail 62. The positive rail may have an open circuit voltage relative to the negative rail 64 and a loaded circuit voltage relative to the negative rail that are substantially equal; further, or instead, the positive rail may have a loaded circuit voltage relative to the negative rail that is equal to or slightly less than a regulatory voltage limit (e.g., a federally imposed limit of 600 V).

In particular embodiments, the DC-DC converter may comprise two sub-converters (e.g., at least one of which is a dual mode converter (see WO2009/051853, and U.S. Pat. No. 7,605,498), at least one of which is a buck converter, and/or at least one of which is neither a dual mode nor buck converter. In particular embodiments, the system may be unipolar or bipolar. Further, the positive rail may be an upper rail and the negative rail may be a lower rail.

At least one embodiment of the inventive technology may be described as a solar power system comprising a string 60 of solar panels; a DC-DC converter 52 established intermediately within the first string of solar panels, the converter dividing the string into a first portion 67 and a second portion 65, the first portion connected with the DC-DC converter through a first string portion conductor 68 and the second portion connected with the DC-DC converter through a second string portion conductor 66; a negative rail 64 connected with the second string portion and the DC-DC converter; a positive rail 62 connected with the first string portion and the DC-DC converter, and a converter conductor 80 traveling from the converter towards the positive rail 62. In certain embodiments: a loaded circuit voltage of the first string portion conductor relative to a voltage of the negative rail has a first string portion loaded circuit voltage value; a loaded circuit voltage of the second string portion conductor relative to a voltage of the negative rail has a second string portion loaded circuit voltage value; a loaded circuit voltage of the positive rail relative to the negative rail has a positive rail loaded circuit voltage value; an open circuit voltage of the positive rail relative to the negative rail has a positive rail open circuit voltage value; a loaded circuit voltage of the converter conductor relative to the negative rail has a converter conductor loaded circuit voltage value; and a sum of the first string portion loaded circuit voltage value and the second string portion loaded circuit voltage value is substantially equal to the converter conductor loaded circuit voltage value. Such may be sweet spot operation, and operating to achieve such condition is sweet spot operating.

The positive rail loaded circuit voltage value may be substantially equal to the positive rail open circuit voltage value, and/or a sum of the first string portion loaded circuit voltage value and the second string portion loaded circuit voltage value is substantially equal to the positive rail loaded circuit voltage value. This condition may be seen during sweet spot operation.

An open circuit voltage of the first string portion conductor relative to the negative rail may have a first string portion open circuit voltage value, an open circuit voltage of the second string portion conductor relative to the negative rail may have a second string portion open circuit voltage value, and an open circuit voltage of the converter conductor relative to the negative rail may have a converter conductor open circuit voltage value. In certain embodiments, a sum of the first string portion open circuit voltage value and the second string portion open circuit voltage value is substantially equal to the converter conductor open circuit voltage value. In certain embodiments, a sum of the first string portion open circuit voltage value and the second string portion open circuit voltage value is substantially equal to the converter conductor loaded circuit voltage value. In particular embodiments, a sum of the first string portion open circuit voltage value and the second string portion open circuit voltage value is less than or equal to a regulatory maximum voltage limit. Relationships between open circuit voltages as described herein may be the result of bucking of voltages by the converter (or sub-converters that may be established therein).

In particular embodiments, the first string portion loaded circuit voltage value is equal to the second string portion loaded circuit voltage. An open circuit voltage of the positive rail relative to the negative rail may be said to be a positive rail open circuit voltage value, and the positive side of the second string portion open circuit voltage value may be substantially equal to the positive rail open circuit voltage value. The negative side of the first-string portion open circuit voltage value may be, in certain embodiments, substantially equal to zero. A sum of the first-string portion loaded circuit voltage value and the second string portion loaded circuit voltage value is substantially equal to the positive rail open circuit voltage value. The positive rail open circuit voltage value may be substantially equal to the positive rail loaded circuit voltage value.

In certain embodiments, the converter conductor is a converter output conductor, and the converter conductor loaded circuit voltage value is conservatively less than a regulatory maximum voltage limit. Further, the converter may include two sub-converters, at least one of which is a dual mode converter; at least one of which may include a buck converter; and at least one of which is neither dual mode, buck, nor boost. Additionally, the negative rail may be a lower rail, and the positive rail may be an upper rail. As with other designs, the power system is unipolar or bipolar.

At least one embodiment of the inventive technology may be described as a solar power control method comprising the steps of generating power from at least two solar panel substrings of a solar power string that is connected to negative and positive rails; maximum power point controlling, with a maximum power point controller, a voltage output by each the at least two solar panel substrings; and converting a power at maximum power point to AC. The step of maximum power point controlling may comprise the step of controlling with a maximum power point controller having at least two switches. Such switches may provide shunting functionality. The step of maximum power point controlling, with a maximum power point controller, a voltage output by each the at least two solar panel substrings may comprise the step of maximum power point controlling, with DC-DC converter.

At least one embodiment of the inventive technology may be described as a solar power control method comprising the steps of generating power from two solar panel substrings of a solar panel string that is connected to negative and positive rails; and mirror image controlling the power from two solar panel substrings of a converter established within the solar power string. Mirror image controlling may involve symmetric identical control where inputs are equal. The step of mirror image controlling the power from the two solar panel substrings may comprise the step of maximum power point controlling. It may involve the step of controlling with two sub-converters that each comprise a switch; such sub-converters may be substantially identical, but perhaps oriented in mirror image fashion, perhaps with any diodes changed from a strict mirror image so as to enable proper functionality as intended.

At least one embodiment of the inventive technology is a solar power control method comprising the steps of: bucking open circuit voltage from each of a plurality of solar panel substrings of a solar panel string of a solar power system, with a converter during open circuit condition; and sweet spot processing loaded circuit voltage from each of the plurality of solar panel substrings during loaded circuit condition. The method may further comprise the step of pulling maximum power point power from the each of the plurality of solar panel substrings during loaded circuit condition. A sum of voltages associated with the maximum power point power of each of the plurality of solar panel substrings may be less than or equal to a maximum regulatory voltage. The step of bucking open circuit voltage from each of a plurality of solar panel substrings may comprise the step of bucking so that a sum of bucked voltages is less than or equal to a maximum regulatory voltage; the step of bucking open circuit voltage from each of a plurality of solar panel substrings comprises the step of bucking open circuit voltage to approximately one-half voltage input to the converter by each of the substrings.

At least one embodiment of the inventive technology may be described as a solar power control system comprising: at least two solar panel substrings of a solar panel string of a solar power system; a controller established so as to maintain an open circuit voltage from the controller during an open circuit condition of the solar power system that is substantially equal to a loaded circuit voltage from the controller during a loaded circuit condition of the solar power system. In certain embodiments, an average of the open circuit voltage and the loaded circuit voltage is substantially equal to a maximum regulatory voltage.

At least one additional embodiment of the inventive technology may be described as a solar power control method comprising the steps of: loaded circuit, high efficiency, high power delivering of power generated by a solar panel string; and converting the delivered power to AC. The step of loaded circuit, high efficiency, high power delivering of power generated by a solar panel string comprises the step of loaded circuit, high efficiency, high power delivering of power generated by at least two solar panel substrings of the solar panel string. The step of loaded circuit, high efficiency, high power delivering of power generated by a solar panel string may comprise the step of neither bucking nor boosting (or simply not comprise the step of bucking or boosting, or comprise the step of refraining from bucking or boosting). The step of loaded circuit, high efficiency, high power delivering of power comprises the step of delivering maximum power point power.

It is of note that during "sweet spot" operation, where a converter has sub-converters, the inputs to and the outputs from each of the sub-converters is also substantially the same.

At least one embodiment of the inventive technology may be described as a solar power string control method, comprising the steps of generating power with solar panels of at least two substrings of a solar power string; managing circuit functionality with a DC-DC converter established intermediately of said string, said power controller defining said substrings (e.g., by dividing a larger string connected between rails into two substrings). The step of managing circuit functionality may comprise the steps of bucking open circuit voltages generated by said substrings, and, perhaps also the step of sweet spot operating during loaded circuit condition. Such converter may also achieve MPP control (e.g., with switches of said converter).

Figure 7:
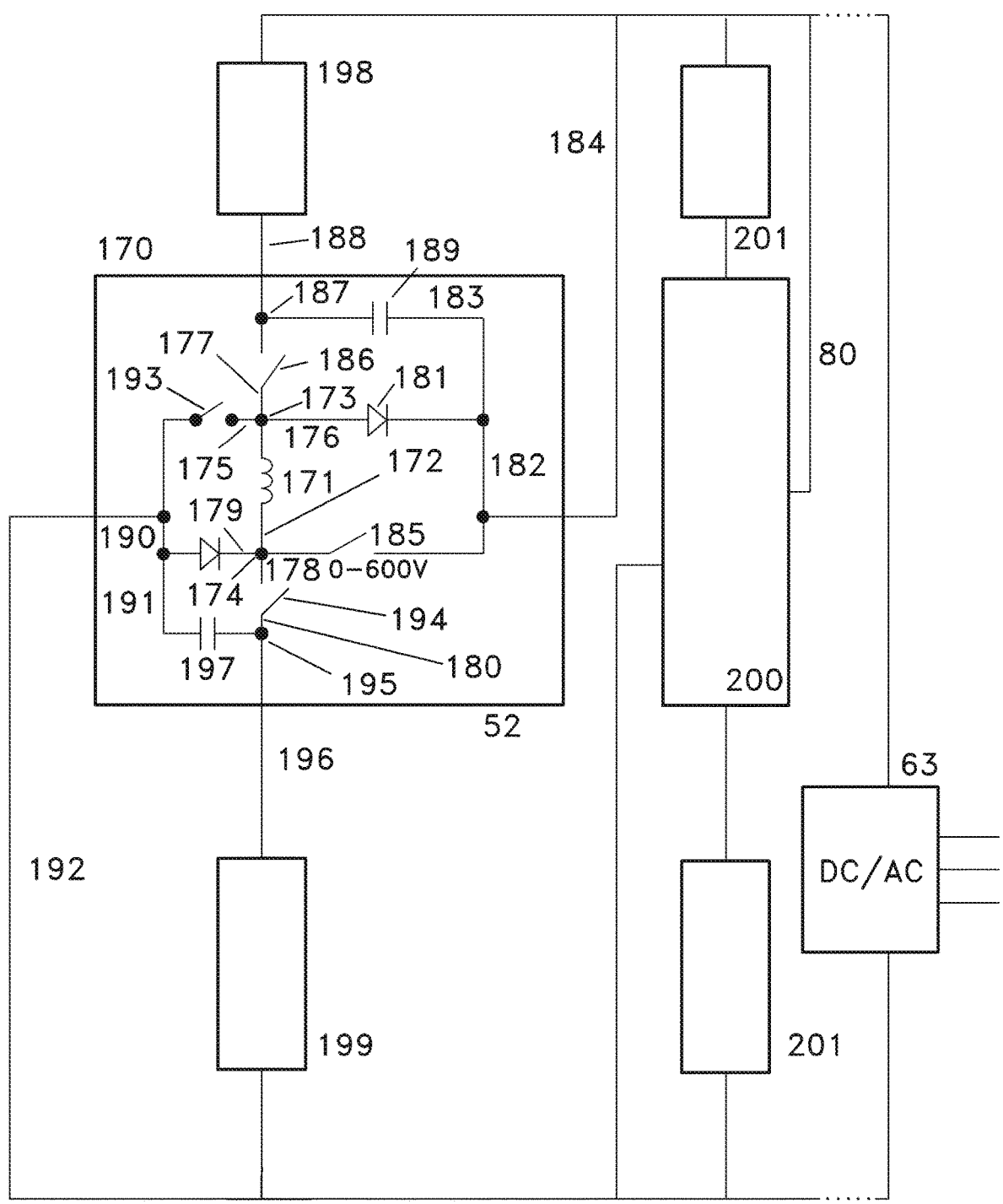
FIG. 7 shows a schematic of one embodiment of an inventive DC-DC power converter.
Figure 8:
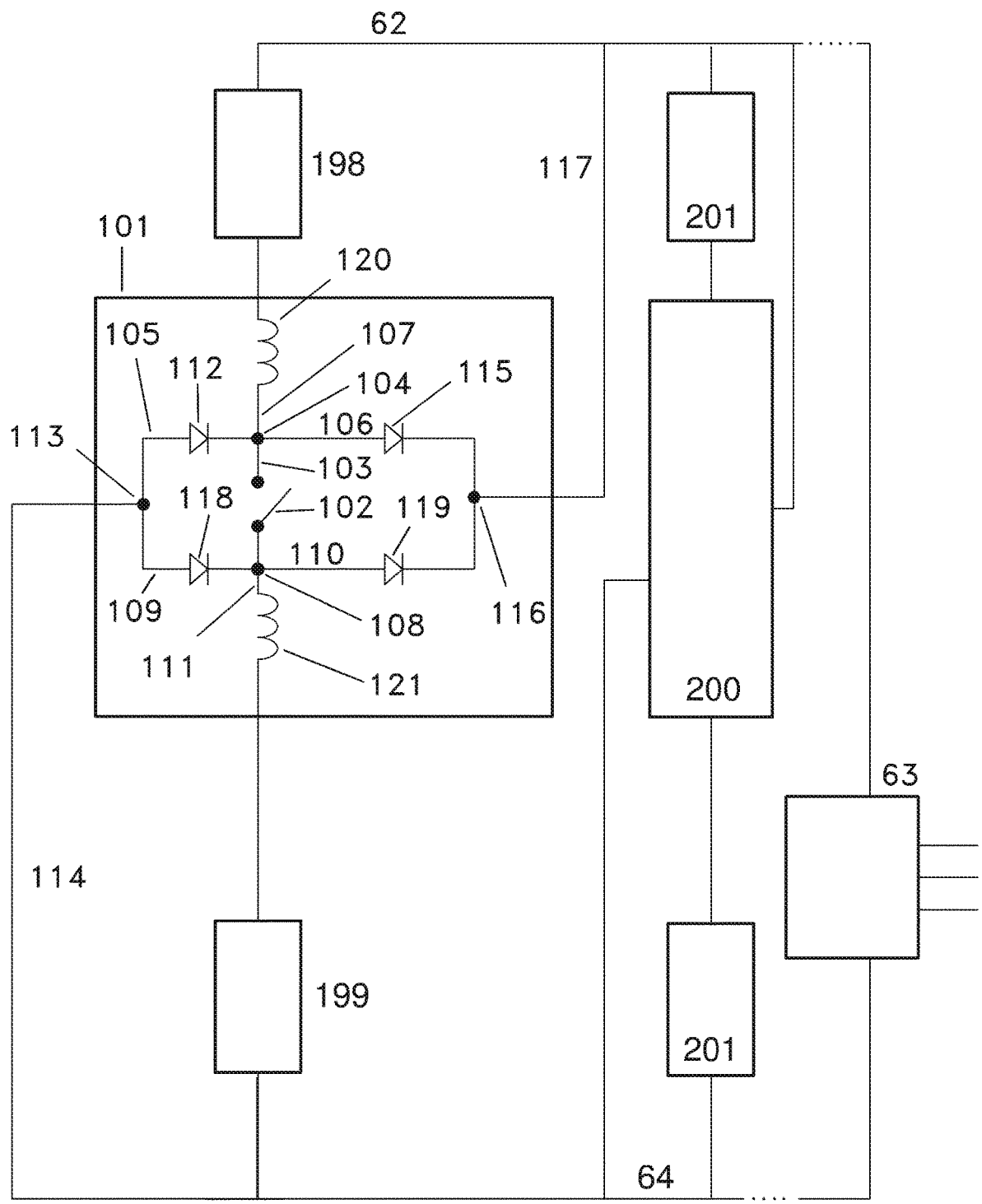
FIG. 8 shows a schematic of one embodiment of an inventive DC-DC power converter.
Figure 9:
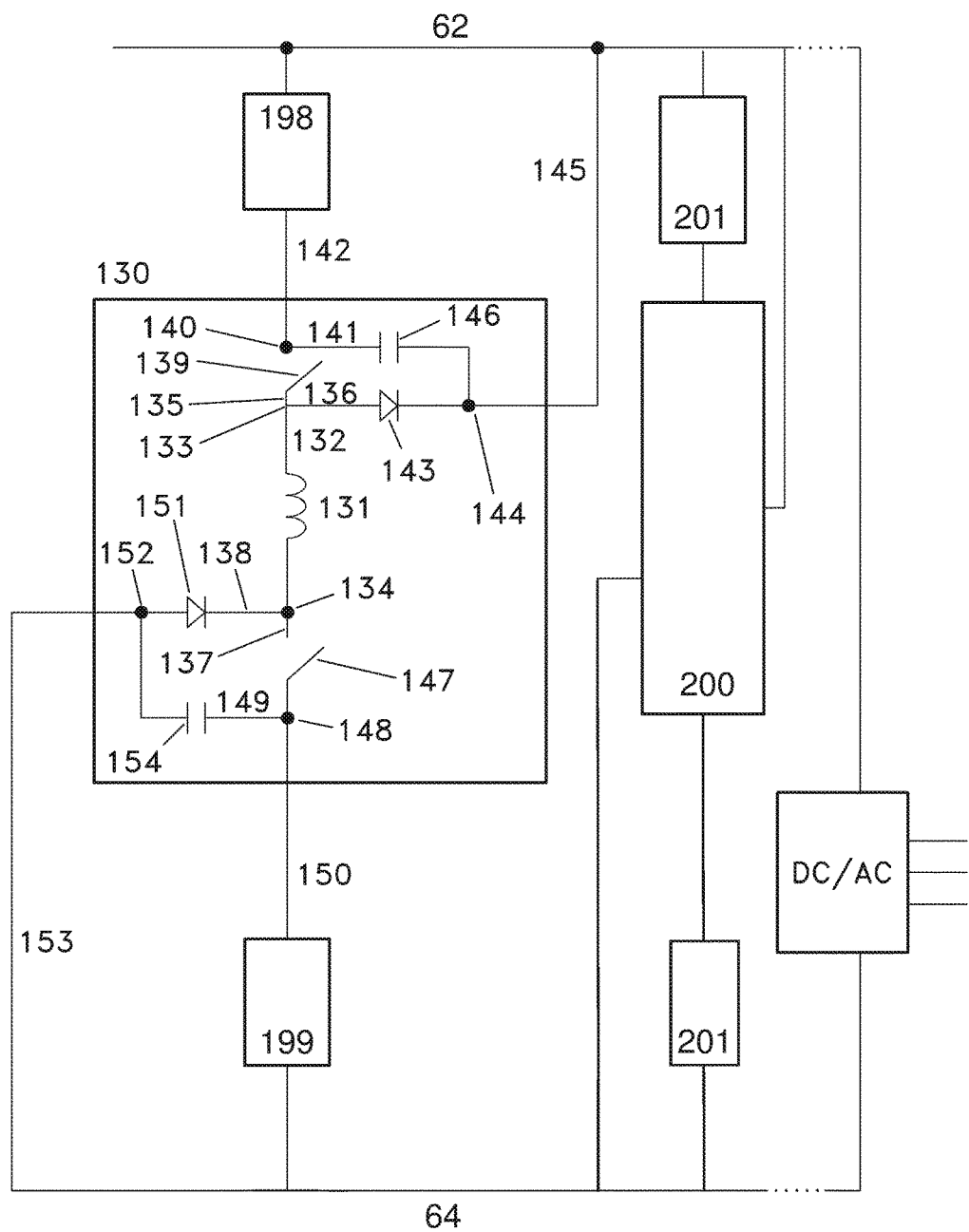
FIG. 9 shows a schematic of one embodiment of an inventive DC-DC power converter.
Figure 10:
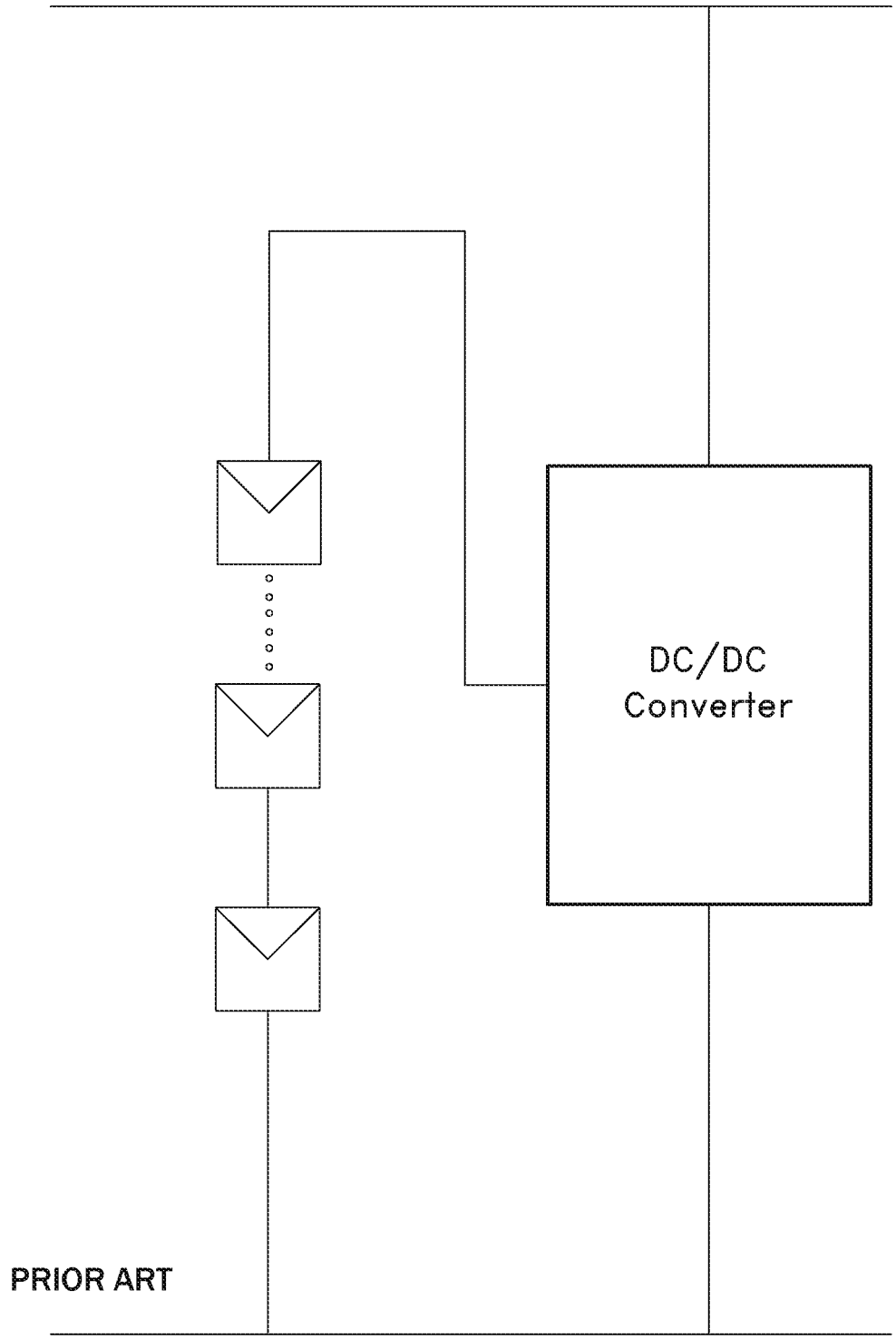
FIG. 10 shows a prior art apparatus.

While novel converters disclosed herein may be, at times, presented in the context of solar array power generation, they may have other applications. FIGS. 7, 8 and 9 show examples of novel converters that may find application as DC-DC converters for MPP control of panel strings or substrings.

As shown in FIG. 8, a DC-DC power converter 101 may comprise: a switch 102 along a first conductor 103 that is established between two nodes, the two nodes including a first 104 node defined by an intersection of the first conductor, a second conductor 105, a third conductor 106 and a fourth conductor 107, and a second node 108 defined by an intersection of the first conductor with a fifth conductor 109, a sixth conductor 110 and a seventh conductor 111; a first diode 112 established along the second conductor between a third node 113 and the first node, the third node defined by an intersection of the second conductor, the fifth conductor, and a lower voltage conductor 114 that electrically connects the converter, the first diode allowing flow towards the first node; a second diode 115 established along the third conductor between the first node and a fourth node 116, the fourth node defined by an intersection of the third conductor, the sixth conductor, and a higher voltage conductor 117 that electrically connects the converter, the second diode allowing flow towards the fourth node; a third diode 118 established along the fifth conductor between the third node and the second node, the third diode allowing flow towards the second node; a fourth diode 119 established along the sixth conductor between the second node and the fourth node, the fourth diode allowing flow towards the fourth node; a first inductor 120 established along the fourth conductor; and a second inductor 121 established along the seventh conductor.

In particular embodiments, the system may further comprise a first power generator 198 electrically connected with the first inductor. The first power generator may be a first solar panel substring; current from the first solar panel substring may flow away from the first node. The first power generator may be electrically connected with the high voltage conductor. The system may further comprise a second power generator 199 electrically connected with the second inductor; the second power generator may be a second solar panel substring. Current from the second solar panel substring may flow towards the second node. Further, the second power generator may be electrically connected with the low voltage conductor. The system may further comprise at least one additional parallely connected converter 200 and additional power generators 201 associated with (e.g., connected with) each of the at least one additional parallely connected converter. In certain embodiments, the higher voltage conductor connects to a positive rail 62, and the first power generator is connected with the positive rail. In certain embodiments, the lower voltage conductor connects to a negative rail 64 and the second power generator is connected with the negative rail. Further, the DC-DC converter may be established within a solar panel string, the DC-DC converter may be part of a unipolar power generation system; and/or the DC-DC converter may be part of a bipolar power generation system.

As shown in FIG. 9, at least one embodiment of the inventive technology may be a DC-DC converter 130 that comprises: an inductor 131 established along a first conductor 132, between a first 133 and a second node 134, the first node defined by an intersection of the first conductor, a second conductor 135, and a third conductor 136, and the second node defined by an intersection of the first conductor, and a fourth 137 and fifth conductor 138; a first switch 139 established along the second conductor between the first node and a third node 140, the third node defined by an intersection of the second conductor, a sixth conductor 141, and a first power generator connector 142; a first diode 143 established along the third conductor between the first node and a fifth node 144 defined by an intersection of the third conductor, the sixth conductor, and a higher voltage conductor 145, the diode allowing flow towards the fifth node; first a capacitor 146 established along the sixth conductor between the third node and the fifth node; a second switch 147 established along the fourth conductor between the second node and a fourth node 148, the fourth node defined by an intersection of the fourth conductor, a seventh conductor 149, and a second power generator connector 150; a second diode 151 established along the fifth conductor between a sixth node 152 and the second node, the sixth node defined by an intersection of the fifth conductor, the seventh conductor, and a lower voltage conductor 153, the diode allowing flow towards the second node; and a second capacitor 154 established along the seventh conductor between the fourth node and the sixth node.

In certain embodiments, the system may include a first power generator 198 connected to the first power generator connector; current may flow from the first power generator away from the DC-DC converter. The system may further comprise a second power generator 199 connected to the second power generator connector; current may from from the second power generator towards the DC-DC converter. The system may further comprise at least one additional parallely connected converter 200 and at least two additional power generators 201 connected with each of the at least one additional parallely connected converter. The converter may be part of a unipolar power generation system or a bipolar power generation system. In certain embodiments, the higher voltage conductor connects to a positive rail 62, as may be the first power generator. The lower voltage conductor may connect to a negative rail 64, as may be second power generator.

As shown in FIG. 7, at least one additional embodiment of the inventive technology may be a DC-DC converter 170 comprising: an inductor 171 established along a first conductor 172 between a first node 173 and a second node 174, the first node defined by an intersection of the first conductor, a second conductor 175, a third conductor 176, and a fourth conductor 177, the second node defined by an intersection of the first conductor, a fifth conductor 178, a sixth conductor 179, and a seventh conductor 180; a first diode 181 established along the third conductor between the first node and a third node, the third node 182 defined by an intersection of the third conductor, the fifth conductor, an eighth conductor 183 and a higher voltage conductor 184, the first diode allowing flow towards the third node; a first switch 185 established along the fifth conductor between the second node and the third node; a second switch 186 established along the fourth conductor between the first node and a fourth node 187, the fourth node defined by an intersection of the fourth conductor, the eighth conductor, and a first power generator connector 188; a first capacitor 189 established along the eighth conductor between the third node and the fourth node; a second diode established along the sixth conductor between the second node and a fifth node 190, the fifth node defined by an intersection of the sixth conductor, a ninth conductor 191, the second conductor, and a lower voltage conductor 192, the second diode allowing flow towards the second node; a third switch 193 established along the second conductor between the first node and the fifth node; a fourth switch 194 established along the seventh conductor between the second node and a sixth node 195, the sixth node defined by an intersection of the seventh conductor, the ninth conductor, and a second power generator connector 196; and a second capacitor 197 established along the ninth conductor between the fifth node and the sixth node. In particular embodiments, the DC-DC converter may be part of a unipolar power generation system or a bipolar power generation system. The first power generator 198 may be connected to the first power generator connector and the higher voltage conductor; current may flow from the first power generator away from the converter. The apparatus may further comprise a second power generator 199 connected to the second power generator connector and the lower voltage conductor. Current may flow from the second power generator towards the converter. The apparatus may further comprise at least one additional parallely connected converter 200 and additional power generators 201.

In the various descriptions provided herein, the following may apply: conductor can be one or more than one wire (it may be whatever conducts). Substantially equal may mean within less than or equal to 20%, 17.5%, 15%, 12.5%, 10%, 7.5%, 5%, or 2.5%. Two components or conductors may be electrically connected even if they are intervening (typically non-converting) devices. Diodes may be optional; indeed some capacitors, particularly in the figures of the various inventive converters, may not even be shown. The term negative rail applies where there is a rail type conductor that is either at negative (e.g., the negative of the positive voltage of the positive rail) or zero volts (negative voltage may be found, e.g., in the case of a bipolar design). It is of note that the inventive converters need not necessarily have power generation connectors as claimed or described, or power generators attached thereto as claimed or described.

As can be easily understood from the foregoing, the basic concepts of the present invention may be embodied in a variety of ways. It involves both control techniques as well as devices to accomplish the appropriate controlling. In this application, the control techniques are disclosed as part of the results shown to be achieved by the various devices described and as steps which are inherent to utilization. They are simply the natural result of utilizing the devices as intended and described. In addition, while some devices are disclosed, it should be understood that these not only accomplish certain methods but also can be varied in a number of ways. Importantly, as to all of the foregoing, all of these facets should be understood to be encompassed by this disclosure.

The discussion included in this application is intended to serve as a basic description. The reader should be aware that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Apparatus claims may not only be included for the device described, but also method or process claims may be included to address the functions the invention and each element performs. Neither the description nor the terminology is intended to limit the scope of the claims that will be included in any subsequent patent application.

It should also be understood that a variety of changes may be made without departing from the essence of the invention. Such changes are also implicitly included in the description. They still fall within the scope of this invention. A broad disclosure encompassing both the explicit embodiment(s) shown, the great variety of implicit alternative embodiments, and the broad methods or processes and the like are encompassed by this disclosure and may be relied upon when drafting the claims for any subsequent patent application. It should be understood that such language changes and broader or more detailed claiming may be accomplished at a later date (such as by any required deadline) or in the event the applicant subsequently seeks a patent filing based on this filing. With this understanding, the reader should be aware that this disclosure is to be understood to support any subsequently filed patent application that may seek examination of as broad a base of claims as deemed within the applicant's right and may be designed to yield a patent covering numerous aspects of the invention both independently and as an overall system.

Further, each of the various elements of the invention and claims may also be achieved in a variety of manners. Additionally, when used or implied, an element is to be understood as encompassing individual as well as plural structures that may or may not be physically connected. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled. As but one example, it should be understood that all actions may be expressed as a means for taking that action or as an element which causes that action. Similarly, each physical element disclosed should be understood to encompass a disclosure of the action which that physical element facilitates. Regarding this last aspect, as but one example, the disclosure of a "converter" should be understood to encompass disclosure of the act of "converting"—whether explicitly discussed or not—and, conversely, were there effectively disclosure of the act of "converting", such a disclosure should be understood to encompass disclosure of a "converter" and even a "means for converting". Such changes and alternative terms are to be understood to be explicitly included in the description.

Any acts of law, statutes, regulations, or rules mentioned in this application for patent; or patents, publications, or other references mentioned in this application for patent are hereby incorporated by reference. Any priority case(s) claimed by this application is hereby appended and hereby incorporated by reference.

Thus, the applicant(s) should be understood to have support to claim and make a statement of invention to at least: i) each of the solar power devices as herein disclosed and described, ii) the related methods disclosed and described, iii) similar, equivalent, and even implicit variations of each of these devices and methods, iv) those alternative designs which accomplish each of the functions shown as are disclosed and described, v) those alternative designs and methods which accomplish each of the functions shown as are implicit to accomplish that which is disclosed and described, vi) each feature, component, and step shown as separate and independent inventions, vii) the applications enhanced by the various systems or components disclosed, viii) the resulting products produced by such systems or components, ix) each system, method, and element shown or described as now applied to any specific field or devices mentioned, x) methods and apparatuses substantially as described hereinbefore and with reference to any of the accompanying examples, xi) the various combinations and permutations of each of the elements disclosed, xii) each potentially dependent claim or concept as a dependency on each and every one of the independent claims or concepts presented, and xiii) all inventions described herein. In addition and as to computer aspects and each aspect amenable to programming or other electronic automation, the applicant(s) should be understood to have support to claim and make a statement of invention to at least: xiv) processes performed with the aid of or on a computer as described throughout the above discussion, xv) a programmable apparatus as described throughout the above discussion, xvi) a computer readable memory encoded with data to direct a computer comprising means or elements which function as described throughout the above discussion, xvii) a computer configured as herein disclosed and described, xviii) individual or combined subroutines and programs as herein disclosed and described, xix) the related methods disclosed and described, xx) similar, equivalent, and even implicit variations of each of these systems and methods, xxi) those alternative designs which accomplish each of the functions shown as are disclosed and described, xxii) those alternative designs and methods which accomplish each of the functions shown as are implicit to accomplish that which is disclosed and described, xxiii) each feature, component, and step shown as separate and independent inventions, and xxiv) the various combinations and permutations of each of the above.

It should be understood that if or when broader claims are presented, such may require that any relevant prior art that may have been considered at any prior time may need to be re-visited since it is possible that to the extent any amendments, claim language, or arguments presented in this or any subsequent application are considered as made to avoid such prior art, such reasons may be eliminated by later presented claims or the like. In drafting any claims at any time whether in this application or in any subsequent application, it should also be understood that the applicant has intended to capture as full and broad a scope of coverage as legally available. To the extent that insubstantial substitutes are made, to the extent that the applicant did not in fact draft any claim so as to literally encompass any particular embodiment, and to the extent otherwise applicable, the applicant should not be understood to have in any way intended to or actually relinquished such coverage as the applicant simply may not have been able to anticipate all eventualities; one skilled in the art, should not be reasonably expected to have drafted a claim that would have literally encompassed such alternative embodiments.

Further, if or when used, the use of the transitional phrase "comprising" is used to maintain the "open-end" claims herein, according to traditional claim interpretation. Thus, unless the context requires otherwise, it should be understood that the term "comprise" or variations such as "comprises" or "comprising", are intended to imply the inclusion of a stated element or step or group of elements or steps but not the exclusion of any other element or step or group of elements or steps. Such terms should be interpreted in their most expansive form so as to afford the applicant the broadest coverage legally permissible. As one clarifying example, if a claim were dependent "on claim 20 or any other claim" or the like, it could be re-drafted as dependent on claim 1, claim 15, or even claim 715 (if such were to exist) if desired and still fall with the disclosure. It should be understood that this phrase also provides support for any combination of elements in the claims and even incorporates any desired proper antecedent basis for certain claim combinations such as with combinations of method, apparatus, process, and the like claims.

What is claimed is:

1. A DC-DC power converter comprising:
    an inductor established along a first conductor, between a first and a second node, said first node defined by an intersection of said first conductor, a second conductor, and a third conductor, and said second node defined by an intersection of said first conductor, a fourth conductor, and a fifth conductor;
    a first switch established along said second conductor between said first node and a third node, said third node defined by an intersection of said second conductor, a sixth conductor, and a first power generator connector;
    a first diode established along said third conductor between said first node and a fifth node defined by an intersection of said third conductor, said sixth conductor, and a higher voltage conductor, said first diode allowing flow towards said fifth node;
    a first capacitor established along said sixth conductor between said third node and said fifth node;
    a second switch established along said fourth conductor between said second node and a fourth node, said fourth node defined by an intersection of said fourth conductor, a seventh conductor, and a second power generator connector;
    a second diode established along said fifth conductor between a sixth node and said second node, said sixth node defined by an intersection of said fifth conductor, said seventh conductor, and a lower voltage conductor, said second diode allowing flow towards said second node; and
    a second capacitor established along said seventh conductor between said fourth node and said sixth node.

2. The DC-DC power converter as described in claim 1 further comprising a first power generator connected to said first power generator connector.

3. The DC-DC power converter as described in claim 2 wherein current flows from said first power generator away from said DC-DC converter.

4. The DC-DC power converter as described in claim 1 further comprising a second power generator connected to said second power generator connector.

5. The DC-DC power converter as described in claim 4 wherein current flows from said second power generator towards said DC-DC converter.

6. The DC-DC power converter as described in claim 1 further comprising at least one additional parallely connected converter and at least two additional power generators connected with each of said at least one additional parallely connected converter.

7. The DC-DC power converter as described in claim 1 wherein said DC-DC converter is part of a unipolar power generation system.

8. The DC-DC power converter as described in claim 1 wherein said DC-DC converter is part of a bipolar power generation system.

9. The DC-DC power converter as described in claim 1 wherein said higher voltage conductor connects to a positive rail.

10. The DC-DC power converter as described in claim 9 wherein said first power generator is connected with said positive rail.

11. The DC-DC power converter as described in claim 1 wherein said lower voltage conductor connects to a negative rail.

12. The DC-DC power converter as described in claim 11 wherein said second power generator is connected with said negative rail.

13. The DC-DC power converter as described in claim 1 wherein said DC-DC converter comprises a photovoltaic DC-DC power converter.

14. The DC-DC power converter as described in claim 2 wherein said first power generator comprises a first solar power generator.

15. The DC-DC power converter as described in claim 14 wherein said first solar power generator comprises a first solar panel substring.

16. The DC-DC power converter as described in claim 4 wherein said second power generator comprises a second solar power generator.

17. The DC-DC power converter as described in claim 16 wherein said second solar power generator comprises a second solar panel substring.

\* \* \* \* \*